US011456343B2

(12) United States Patent
Son et al.

(10) Patent No.: US 11,456,343 B2
(45) Date of Patent: Sep. 27, 2022

(54) ORGANIC LIGHT EMITTING DISPLAY PANEL HAVING IMPROVED LIGHT EFFICIENCY AND ORGANIC LIGHT EMITTING DISPLAY DEVICE INCLUDING THE SAME

(71) Applicant: LG DISPLAY CO., LTD., Seoul (KR)

(72) Inventors: SeokWoo Son, Gyeonggi-do (KR); JungSun Baek, Gyeonggi-do (KR); Joyeon Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 67 days.

(21) Appl. No.: 17/021,514

(22) Filed: Sep. 15, 2020

(65) Prior Publication Data

US 2021/0091154 A1 Mar. 25, 2021

(30) Foreign Application Priority Data

Sep. 20, 2019 (KR) ........................ 10-2019-0115803

(51) Int. Cl.
*H01L 27/32* (2006.01)
*H01L 51/52* (2006.01)
(52) U.S. Cl.
CPC ...... *H01L 27/3246* (2013.01); *H01L 27/3211* (2013.01); *H01L 51/5218* (2013.01)

(58) Field of Classification Search
CPC ............ H01L 27/3246; H01L 27/3211; H01L 51/5218
USPC ........................................................... 257/40
See application file for complete search history.

(56) References Cited

U.S. PATENT DOCUMENTS

| 2010/0102335 A1* | 4/2010 | Takagi | ............... H01L 27/3276 257/88 |
| 2014/0353595 A1* | 12/2014 | Choi | .................. H01L 27/3246 257/40 |
| 2021/0098650 A1* | 4/2021 | Lin | ....................... H01L 33/505 |

\* cited by examiner

*Primary Examiner* — Xia L Cross
(74) *Attorney, Agent, or Firm* — Birch, Stewart, Kolasch & Birch, LLP

(57) ABSTRACT

Embodiments of the disclosure relate to an organic light emitting display panel and organic light emitting display device including the same, and more specifically, to an organic light emitting display panel and organic light emitting display device which includes an insulation film including at least one concave portion including a flat portion and an inclined portion surrounding the flat portion in at least one subpixel of the active area and a first electrode of an organic light emitting diode disposed on a portion of the concave portion and a surrounding portion disposed around the concave portion in the at least one subpixel area and including at least one protrusion on a surface thereof, thereby enhancing light extraction efficiency.

25 Claims, 16 Drawing Sheets

ORGANIC LIGHT EMITTING DISPLAY PANEL HAVING IMPROVED LIGHT EFFICIENCY AND ORGANIC LIGHT EMITTING DISPLAY DEVICE INCLUDING THE SAME

CROSS-REFERENCE TO RELATED APPLICATION

This application claims priority from Korean Patent Application No. 10-2019-0115803, filed on Sep. 20, 2019, which is hereby incorporated by reference for all purposes as if fully set forth herein.

BACKGROUND

Field

Various embodiments of the disclosure relate to an organic light emitting display panel and an organic light emitting display device including the same.

Description of Related Art

The growth of the intelligent society leads to increased demand for various types of display panels, as for display devices or lighting devices. Among display panels, organic light emitting display panels may be thin and lightweight with no need for a separate light source, thus gaining popularity.

The organic light emitting display panel includes an organic layer to emit light. Part of the light emitted from the organic layer may be trapped inside the organic light emitting display device. Thus, the light extraction efficiency of the organic light emitting display panel may be lowered, and so is the lighting efficiency.

BRIEF SUMMARY

Embodiments of the disclosure aim to provide an organic light emitting display panel and organic light emitting display device, which has a structure with enhanced light extraction efficiency.

Embodiments of the disclosure also aim to provide an organic light emitting display panel and organic light emitting display device, which has a structure capable of preventing color mixing between two adjacent subpixels.

Embodiments of the disclosure also aim to provide an organic light emitting display panel and organic light emitting display device, which has an increased emitting area in the active area.

According to embodiments of the disclosure, there may be provided an organic light emitting display panel including an active area with a plurality of subpixels, comprising a substrate, an insulation film disposed on the substrate and including at least one concave portion, the at least one concave portion including a flat portion and an inclined portion surrounding the flat portion in at least one subpixel of the active area, a first electrode disposed on a portion of the concave portion and a surrounding portion disposed around the concave portion in the at least one subpixel area, the first electrode including at least one protrusion on a surface thereof, a bank including a first portion disposed on the first electrode in an area corresponding to a portion of the concave portion and a second portion disposed on the insulation film and the first electrode in an area corresponding to the surrounding portion, an organic layer overlapping the concave portion and disposed on the first electrode, the organic layer having a surface shape corresponding to a shape of a top surface of the first electrode having the protrusion on the first electrode, and a second electrode disposed on the organic layer and the bank, the second electrode having a surface shape corresponding to the surface shape of the organic layer in an area overlapping the organic layer.

According to embodiments of the disclosure, there may be provided an organic light emitting display device including an active area with a plurality of subpixels, comprising an insulation film disposed on a substrate and including at least one concave portion, the at least one concave portion including a flat portion and an inclined portion surrounding the flat portion in at least one subpixel area, a first electrode disposed on a portion of the concave portion and a surrounding portion disposed around the concave portion in the at least one subpixel area, the first electrode including at least one protrusion on a surface thereof, a bank including a first portion positioned on a portion of the concave portion and a second portion positioned on the surrounding portion, an organic layer overlapping the concave portion and disposed on the first electrode, the organic layer having a surface shape corresponding to a shape of a top surface of the first electrode having the protrusion on the first electrode, and a second electrode having a surface shape corresponding to the surface shape of the organic layer in an area overlapping the organic layer, wherein an area in which the first electrode does not overlap the bank is a first light emitting part in an area where the flat portion is provided, wherein an area in which the bank overlaps the first electrode is a first non-light emitting part in the area where the flat portion is provided, and wherein an area corresponding to the inclined portion is a second light emitting part.

According to embodiments of the disclosure, there may be provided an organic light emitting display panel including an active area with a plurality of subpixels, comprising: a substrate; an insulation film disposed on the substrate and including at least one concave portion, the at least one concave portion including a flat portion and an inclined portion surrounding the flat portion in at least one subpixel of the active area; a first electrode disposed on a portion of the concave portion and a surrounding portion disposed around the concave portion in the at least one subpixel area, the first electrode including at least one protrusion on a surface thereof; a bank including a first portion disposed on the first electrode in an area corresponding to a portion of the concave portion and a second portion disposed on the insulation film and the first electrode in an area corresponding to the surrounding portion; and an organic layer overlapping the concave portion and disposed on the first electrode, wherein a height of the inclined portion is larger than or equal to a height of the second portion of the bank.

According to embodiments of the disclosure, there may be provided an organic light emitting display panel and organic light emitting display device, which has a structure with enhanced light extraction efficiency.

According to embodiments of the disclosure, there may be provided an organic light emitting display panel and organic light emitting display device, which has a structure capable of preventing color mixing between two adjacent subpixels.

According to embodiments of the disclosure, there may be provided an organic light emitting display panel and organic light emitting display device, which has an increased emitting area in the active area.

DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
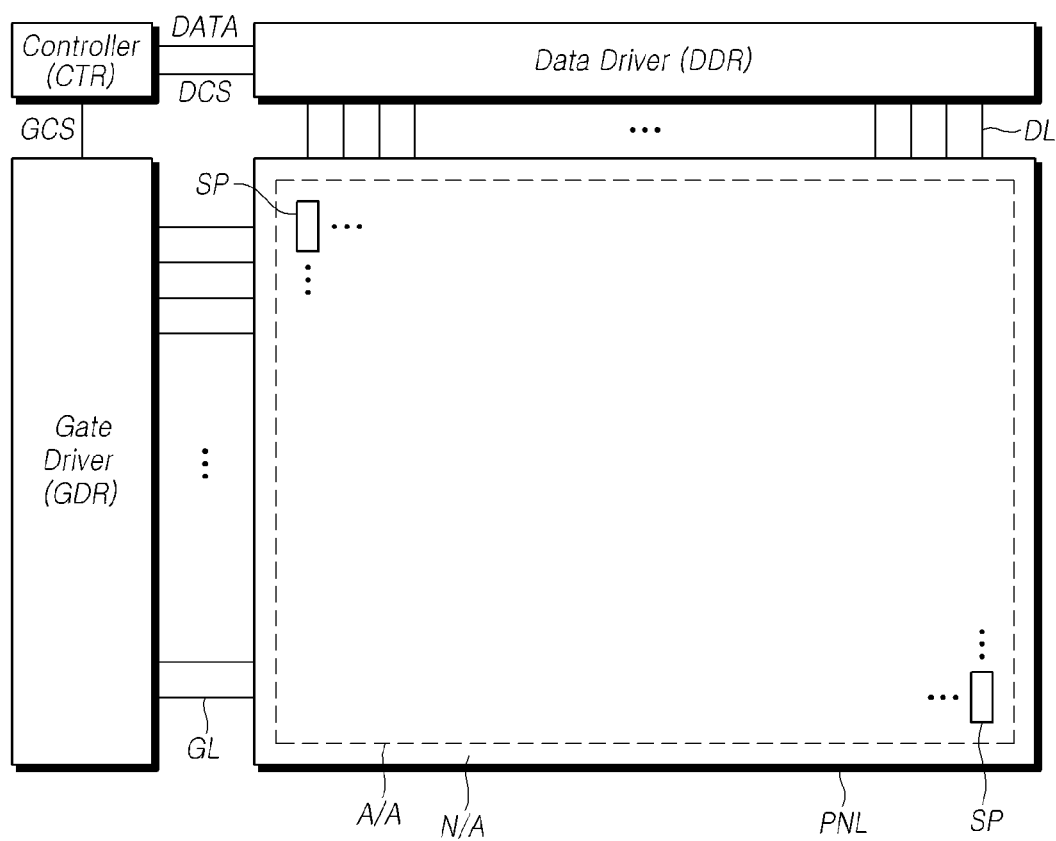
FIG. 1 is a view schematically illustrating a system configuration of an organic light emitting display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, embodiments of the disclosure are described in detail with reference to the accompanying drawings.

FIG. 1 is a view schematically illustrating a system configuration of an organic light emitting display device according to embodiments of the disclosure.

According to embodiments of the disclosure, a display device may include a panel PNL for displaying images or outputting light and a driving circuit for driving the panel PNL.

The panel PNL may include a plurality of data lines DL, a plurality of gate lines GL, and a plurality of subpixels SP defined by the plurality of data lines DL and the plurality of gate lines GL and arranged in a matrix type.

In the panel PNL, the plurality of data lines DL and the plurality of gate lines GL may be disposed to cross each other. For example, the plurality of gate lines GL may be arranged in rows or columns, and the plurality of data lines DL may be arranged in columns or rows. For ease of description, it is assumed below that the plurality of gate lines GL are arranged in rows, and the plurality of data lines DL are arranged in columns.

The panel PNL may have other kinds of signal wires, as well as the plurality of data lines DL and the plurality of gate lines GL, depending on, e.g., the subpixel structure. The panel PNL may further have driving voltage wires, reference voltage wires, or common voltage wires.

The kind of the signal wires disposed on the panel PNL may be varied depending on, e.g., the subpixel structure or panel type. In this disclosure, the concept of signal wire may encompass signal-applied electrodes.

The panel PNL may include an active area A/A for displaying pictures or images and a non-active area N/A, in which no image is displayed, around the active area A/A. The non-active area N/A is also referred to as a bezel area.

The active area A/A includes a plurality of subpixels SP for displaying images.

The non-active area N/A has a pad area for electrical connection with a data driver DDR and may have a plurality of data link lines to connect the pad area with the plurality of data lines DL. The plurality of data link lines may be extensions of the plurality of data lines DL to the non-active area N/A or may be separate patterns electrically connected with the plurality of data lines DL.

The non-active area N/A may also include gate driving-related wires to transfer voltage (signals) necessary for gate driving to a gate driver GDR through pads electrically connected with the data driver DDR. For example, the gate driving-related wires may include clock wires for transferring clock signals, gate voltage wires for transferring gate voltages VGH and VGL, and gate driving control signal wires for transferring various control signals necessary to generate scan signals. The gate driving-related wires are disposed in the non-active area N/A, unlike the gate lines GL disposed in the active area A/A.

The driving circuit may include the data driver DDR for driving the plurality of display device, the gate driver GDR for driving the plurality of gate lines GL, and a controller CTR for controlling the data driver DDR and the gate driver GDR.

The data driver DDR may drive the plurality of data lines DL by outputting data voltage to the plurality of data lines DL.

The gate driver GDR may drive the plurality of gate lines GL by outputting scan signals to the plurality of gate lines GL.

The controller CTR may control the driving operation of the data driver DDR and gate driver GDR by supplying various control signals DCS and GCS necessary for the driving operation of the data driver DDR and gate driver GDR. Further, the controller CTR may supply image data DATA to the data driver DDR.

The controller CTR starts scanning according to a timing implemented in each frame, converts input image data input from the outside into image data DATA suited for the data signal format used in the data driver DDR, outputs the image data DATA, and controls data driving at an appropriate time suited for scanning.

To control the data driver DDR and gate driver GDR, the controller CTR receives timing signals, such as a vertical sync signal Vsync, horizontal sync signal Hsync, input data enable signal (Data Enable, DE), or clock signal CLK from the outside (e.g., a host system), generates various control signals, and outputs the control signals to the data driver DDR and gate driver GDR.

As an example, to control the gate driver GDR, the controller CTR outputs various gate control signals GCS including a gate start pulse GSP, a gate shift clock GSC, and a gate output enable signal (Gate Output Enable, GOE).

To control the data driver DDR, the controller CTR outputs various data control signals DCS including, e.g., a source start pulse SSP, a source sampling clock SSC, and a source output enable signal (Source Output Enable, SOE).

The controller CTR may be a timing controller used in typical display technology, or a control device that may perform other control functions as well as the functions of the timing controller.

The controller CTR may be implemented as a separate component from the data driver DDR, or the controller CTR, along with the data driver DDR, may be implemented as an integrated circuit.

The data driver DDR receives the image data DATA from the controller CTR and supply data voltage to the plurality of data lines DL, thereby driving the plurality of data lines DL. Here, the data driver DDR is also referred to as a source driver.

The data driver DDR may exchange various signals with the controller CTR via various interfaces.

The gate driver GDR sequentially drives the plurality of gate lines GL by sequentially supplying scan signals to the plurality of gate lines GL. Here, the gate driver GDR is also referred to as a scan driver.

The gate driver GDR sequentially supplies scan signals of On voltage or Off voltage to the plurality of gate lines GL under the control of the controller CTR.

When a specific gate line is opened by the gate driver GDR, the data driver DDR converts the image data DATA received from the controller CTR into an analog data voltage and supplies the analog data voltage to the plurality of data lines DL.

The data driver DDR may be positioned on only one side (e.g., the top or bottom side) of the panel PNL and, in some cases, the data driver DDR may be positioned on each of two opposite sides (e.g., both the top and bottom sides) of the panel PNL depending on, e.g., driving schemes or panel designs.

The gate driver GDR may be positioned on only one side (e.g., the left or right side) of the panel PNL and, in some cases, the gate driver GDR may be positioned on each of two opposite sides (e.g., both the left and right sides) of the panel PNL depending on, e.g., driving schemes or panel designs.

The data driver DDR may include one or more source driver integrated circuits (SDICs).

Each source driver integrated circuit (SDIC) may include a shift register, a latch circuit, a digital-to-analog converter (DAC), and an output buffer. In some cases, the data driver DDR may further include one or more analog-digital converters ADC.

Each source driver integrated circuit (SDIC) may be connected, in a tape automated bonding (TAB) type or chip-on-glass (COG) type, to the bonding pad of the panel PNL or may be disposed directly on the panel PNL. In some cases, each source driver integrated circuit (SDIC) may be integrated and disposed on the panel PNL. Each source driver integrated circuit (SDIC) may be implemented in a chip-on-film (COF) type. In this case, each source driver integrated circuit (SDIC) may be mounted on a circuit film and be electrically connected with the data lines DL of the panel PNL through the circuit film.

The gate driver GDR may include a plurality of gate driving circuits GDC. The plurality of gate driving circuits may respectively correspond to the plurality of gate lines GL.

Each gate driving circuit GDC may include, e.g., a shift register and a level shifter.

Each gate driving circuit GDC may be connected, in a tape automated bonding (TAB) type or chip-on-glass (COG) type, to the bonding pad of the panel PNL. Each gate driving circuit GDC may be implemented in a chip-on-film (COF) scheme. In this case, each gate driving circuit GDC may be mounted on a circuit film and be electrically connected with the gate lines GL of the panel PNL through the circuit film. Each gate driving circuit GDC may be implemented in a gate-in-panel (GIP) type and be embedded in the panel PNL. In other words, each gate driving circuit GDC may be formed directly on the panel PNL.

Figure 2:
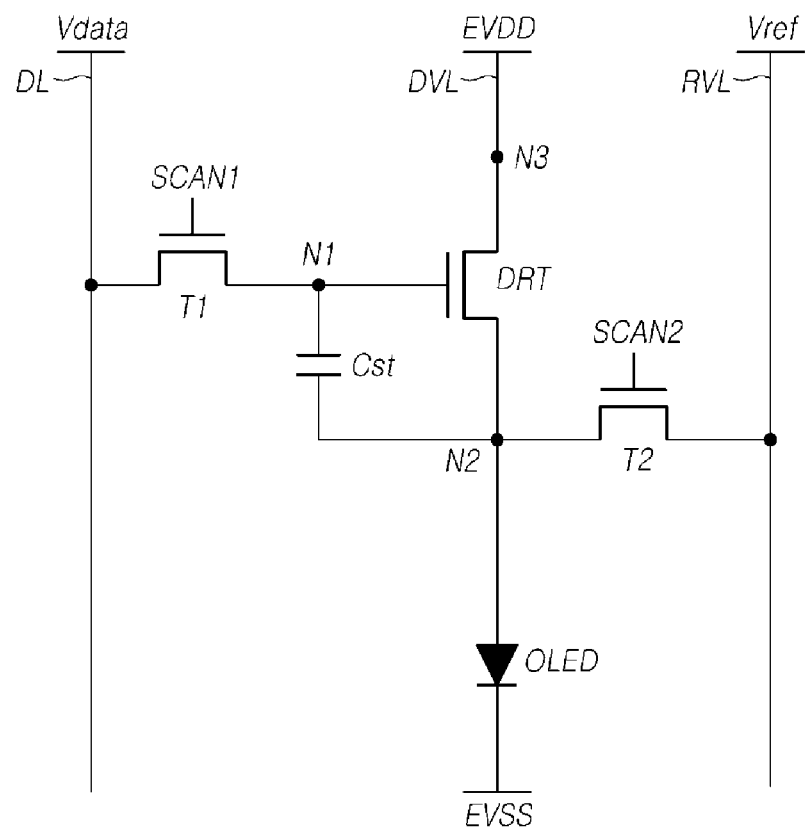
FIG. 2 is a view illustrating an example 3T (Transistor) 1O (Capacitor) structure in which one subpixel further includes a second transistor electrically connected between a second node of a driving transistor and a reference voltage line.

FIG. 2 is a view illustrating an example 3T (Transistor) 1C (Capacitor) structure in which one subpixel further includes a second transistor electrically connected between a second node of a driving transistor and a reference voltage line.

Referring to FIG. 2, a second transistor T2 may be electrically connected between a second node N2 of a driving transistor DRT and a reference voltage line RVL and receive a second scan signal SCAN2 through the gate node to be controlled of its On/Off.

An anode (also referred to as a pixel electrode) of an organic light-emitting diode OLED can be electrically connected to the second node N2 of the driving transistor DRT. A cathode (also referred to as a common electrode) of the organic light-emitting diode OLED can have a base voltage EVSS applied thereto.

The drain node or source node of the second transistor T2 may be electrically connected with the reference voltage line RVL, and the source node or drain node of the second transistor T2 may be electrically connected with the second node N2 of the driving transistor DRT.

The second transistor T2 may be turned on, e.g., in a display driving time period and be turned on in a sensing driving time period for sensing the characteristic values of the driving transistor DRT or the characteristic values of the organic light emitting diode (OLED).

In sync with a relevant driving timing (e.g., a display driving timing or an initialization timing in the sensing driving time period), the second transistor T2 may be turned by the second scan signal SCAN2, transferring the reference voltage Vref supplied to the reference voltage line RVL to the second node N2 of the driving transistor DRT.

In sync with a relevant driving timing (e.g., a sampling timing in the sensing driving time period), the second transistor T2 may be turned on by the second scan signal SCAN2, transferring the voltage of the second node N2 of the driving transistor DRT to the reference voltage line RVL.

In other words, the second transistor T2 may control the voltage state of the second node N2 of the driving transistor DRT or transfer the voltage of the second node N2 of the driving transistor DRT to the reference voltage line RVL.

The reference voltage line RVL may be electrically connected with an analog-to-digital converter that senses the voltage of the reference voltage line RVL, converts the voltage into a digital value, and outputs sensing data including the digital value.

The analog-to-digital converter may be included in the source driver integrated circuit (SDIC) that implements the data driver DDR.

The sensing data output from the analog-to-digital converter may be used to sense the characteristic values (e.g., threshold voltage or mobility) of the driving transistor DRT or the characteristic values (e.g., threshold voltage) of the organic light emitting display diode (OLED).

A capacitor Cst may be an external capacitor intentionally designed to be outside the driving transistor DRT, but not a parasite capacitor (e.g., Cgs or Cgd) which is an internal capacitor present between the first node N1 and the second node N2 of the driving transistor DRT.

The third node N3 of the driving transistor DRT can be a drain node or a source node, to which a driving voltage EVDD may be applied. The third node N3 can be electrically connected to a driving voltage line DVL, through which the driving voltage EVDD is supplied.

The storage capacitor Cst can be electrically connected between the first node N1 and the second node N2 of the driving transistor DRT to maintain a data voltage Vdata corresponding to an image signal voltage or a voltage corresponding to the data voltage Vdata during a single frame time (or a predetermined time).

Each of the driving transistor DRT, the first transistor T1, and the second transistor T2 may be an n-type transistor or p-type transistor.

The first scan signal SCAN1 and the second scan signal SCAN2 may be separate gate signals. In this case, the first scan signal SCAN1 and the second scan signal SCAN2, respectively, may be applied to the gate node of the first transistor T1 and the gate node of the second transistor T2 through different gate lines.

In some cases, the first scan signal SCAN1 and the second scan signal SCAN2 may be the same gate signals. In this case, the first scan signal SCAN1 and the second scan signal SCAN2 may be jointly applied to the gate node of the first transistor T1 and the gate node of the second transistor T2 through the same gate line.

Each subpixel structure shown in FIG. 2 is merely an example, and one or more transistors may be omitted or added and, in some cases, one or more capacitors may be added.

The plurality of subpixels may have the same structure, or some of the plurality of subpixels may have a different structure.

The brightness of the panel PNL may be varied depending on the amount of the light emitted from the organic light emitting diodes (OLEDs) arranged in the active area A/A and exposed to the outside. In other words, as the amount of the light emitted from the OLEDs and extracted increases, the brightness of the panel PNL may increase. Described below is the structure of a thin film transistor array film having a structure with enhanced light extraction.

At least one subpixel of the plurality of subpixels disposed in the active area may include at least one concave portion in the insulation film.

The organic light emitting display panel is described below in greater detail with reference to various figures.

Figure 3:
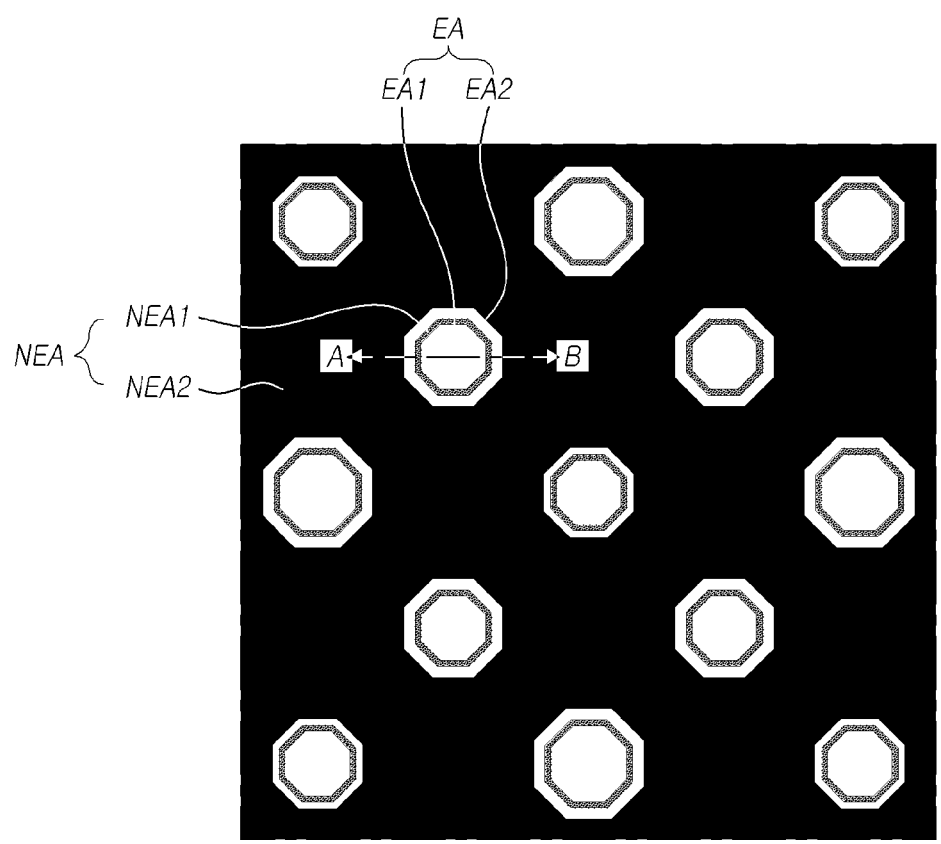
FIG. 3 is a plan view illustrating a light emitting part and a non-light emitting part included in an active area of an organic light emitting display panel according to embodiments of the disclosure.
Figure 4:
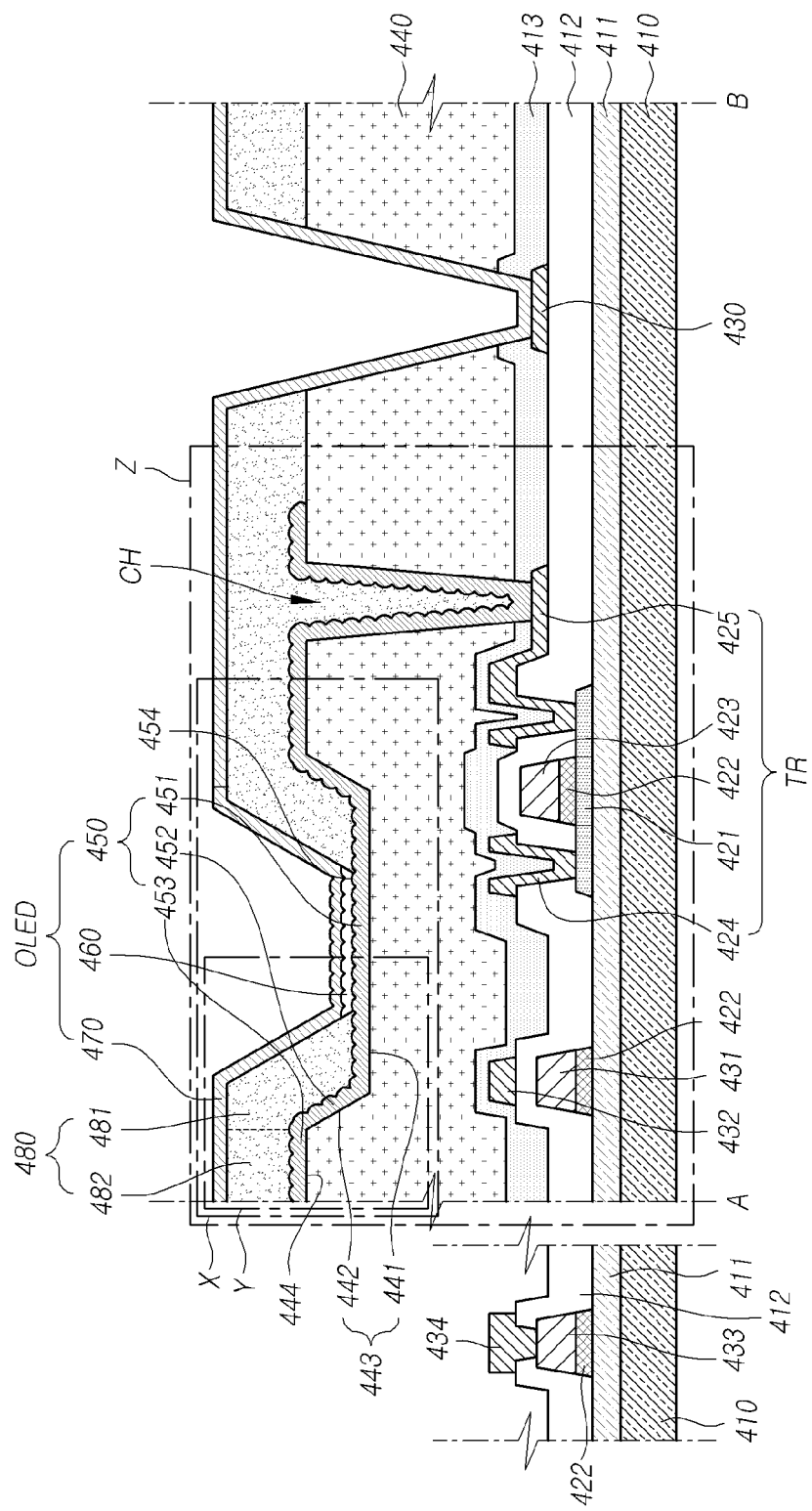
FIG. 4 is a cross-sectional view illustrating an area taken along line A-B of FIG. 3 and a portion of a pad area.

FIG. 3 is a plan view illustrating a light emitting part and a non-light emitting part included in an active area of an organic light emitting display panel according to embodiments of the disclosure. FIG. 4 is a cross-sectional view illustrating an area taken along line A-B of FIG. 3 and a portion of a pad area. FIG. 4 may illustrate only a partial configuration disposed in one subpixel SP and a partial area, e.g., a partial configuration disposed in a pad area and a partial area.

Referring to FIG. 3, a plurality of light emitting parts EA and a plurality of non-light emitting parts NEA are disposed in the active area A/A.

As shown in FIG. 3, the light emitting parts EA of at least two or more subpixels SP may have different sizes but embodiments of the disclosure are not limited thereto.

Each subpixel SP disposed in the active area A/A may include a plurality of light emitting parts EA1 and EA2.

Specifically, one subpixel SP may include a first light emitting part EA1 and a second light emitting part EA2 surrounding the first light emitting part EA1.

A first non-light emitting part NEA1 may be disposed between the first light emitting part EA1 and the second light emitting part EA2.

In other words, the first light emitting part EA1 and the second light emitting part EA2 may be differentiated from each other by the first non-light emitting part NEA1.

The first non-light emitting part NEA1 may be smaller in size than the first light emitting part EA1 and the second light emitting part EA2.

The first non-light emitting part NEA1 may be in a black state when the display device is in an on state, or the first non-light emitting part NEA1 may have a lower brightness than the first and second light emitting parts EA1 and EA2 due to the light incident from at least one of the first light emitting part EA1 and the second light emitting part EA2.

As shown in FIG. 3, the first light emitting part EA1, second light emitting part EA2, and first non-light emitting part NEA1 each may be octagonal at plan view. However, embodiments of the disclosure are not limited thereto. For example, the first light emitting part EA1, second light emitting part EA2, and first non-light emitting part NEA1 each may be shaped as a circle, ellipse, or polygon, e.g., a triangle, square, or hexagon, or a combination thereof, in shape.

A pair of first and second light emitting parts EA1 and EA2 may be spaced apart from another pair of first and second light emitting parts EA1 and EA2, and the second non-light emitting part NEA2 may be disposed therebetween.

The second non-light emitting part NEA2 may be an area corresponding in whole or part to a circuit area where circuitry for driving the first and second light emitting parts EA1 and EA2 are disposed.

When the display device is in an on state, the second non-light emitting part NEA2 may be in a black state or may have a lower brightness than the first and second light emitting parts EA1 and EA2 due to the light incident from the second light emitting part EA2.

When the first non-light emitting part NEA1 and the second non-light emitting part NEA2 have a lower brightness than the first and second light emitting parts EA1 and EA2, the brightness of the first non-light emitting part NEA1 may be higher than the brightness of the second non-light emitting part NEA2, but embodiments of the disclosure are not limited thereto.

Referring to FIG. 4, a transistor TR disposed on a substrate 410 and an organic light emitting diode (OLED) electrically connected with the transistor TR are disposed in the active area A/A (the area taken along line A-B). At least one pad area is present in the non-active area N/A.

The transistor TR includes an active layer 421, a gate electrode 423, a source electrode 424, and a drain electrode 425.

The organic light emitting diode (OLED) includes a first electrode 450, an organic layer 460 including a light emission layer, and a second electrode 470. The first electrode 450 may be an anode electrode, and the second electrode 470 may be a cathode electrode, but embodiments of the disclosure are not limited thereto.

Specifically, a buffer layer 411 is disposed on the substrate 410. The active layer 421 of the transistor TR is disposed on the buffer layer 411. A gate insulation film 422 is disposed on the active layer 421, and a gate electrode 423 is disposed on the gate insulation film 422.

Although not shown in FIG. 4, the active layer 421 may include a channel area, and the channel area of the active layer 421 may overlap the gate insulation film 422 and the gate electrode 423, according to embodiments of the disclosure. In other words, the gate insulation film 422 and the gate electrode 423 may be disposed on the channel area of the active layer 421.

An inter-layer insulation film 412 is disposed on the gate electrode 423. The source electrode 424 and the drain electrode 425 are disposed on the inter-layer insulation film 412. The source electrode 424 and the drain electrode 425 may be spaced apart from each other on the inter-layer insulation film 412. The source electrode 424 and the drain electrode 425 each may contact the active layer 421 through a hole formed in the inter-layer insulation film 412.

Although the transistor TR may be disposed on the substrate 410 in the above-described structure, the transistor structure of the disclosure is not limited thereto.

For example, the gate electrode 423 may be disposed on the substrate 410, the active layer 421 may be disposed on the gate electrode 423, the source electrode 424 may be disposed to overlap an end of the active layer 421, and the drain electrode 425 may be disposed to overlap the opposite end of the active layer 421 on the active layer 421.

A protection film 413 may be disposed while covering the transistor TR.

An insulation film 440 may be disposed on the protection film 413.

The insulation film 440 may be formed of an organic material, but embodiments of the disclosure are not limited thereto.

The insulation film 440 may have at least one concave portion 443 in one subpixel area. The insulation film 440 may have a surrounding portion 444 that surrounds the concave portion 443 and is positioned around the concave portion 443. The concave portion 443 may include a flat portion 441 and an inclined portion 442 surrounding the flat portion 441.

The surface of the flat portion 441 of the concave portion 443 may be parallel with the surface of the substrate 410, and the inclined portion 442 may surround the flat portion 441, and a predetermined angle may be formed between the surface of the inclined portion 442 and the surface of the substrate 410. In other words, the surface of the inclined portion 442 may be not parallel with the surface of the substrate 410.

The insulation film 440 may have a contact hole CH spaced apart from the concave portion 443.

In at least one subpixel area, the first electrode 450 may be disposed on the concave portion 443 and surrounding portion 444 of the insulation film 440.

In the area overlapping the concave portion 443, the first electrode 450 includes a first area 451 in which the top surface of the first electrode 450 is parallel with the surface of the substrate 410 and a second area 452 extending from the first area 451. In the second area 452, a predetermined angle is formed between the top surface of the first electrode 450 and the substrate 410. In other words, the surface of the second area 452 may be not parallel with the surface of the substrate 410. The first electrode 450 includes a third area 453 extending from the second area 452 and, in the third area 453, the top surface of the first electrode 450 is parallel with the surface of the substrate 410. The third area 453 may be an area overlapping the surrounding portion 444 of the insulation film 440.

As described above, in at least one subpixel area, the insulation film 440 may include at least one contact hole CH spaced apart from the concave portion 443, and the transistor TR may be electrically connected with the first electrode 450 of the organic light emitting diode (OLED) through the contact hole CH of the insulation film 440.

Specifically, the first electrode 450 may be electrically connected with the source electrode 424 or drain electrode 425 of the transistor TR.

At least one protrusion 454 may be provided on the top surface of the first electrode 450 of the organic light emitting diode (OLED).

For example, as shown in FIG. 4, the protrusion 454 may be provided on the top surface of the first electrode 450 in the area corresponding to the first to third areas 451, 452, and 453 of the first electrode 450.

Alternatively, the protrusion 454 may be provided in a whole area corresponding to the area where the concave portion 443 of the insulation film 440 is disposed or be provided in a whole area corresponding to the area where the surrounding portion 444 of the insulation film 440 is disposed. In this case, the protrusion 454 may also be provided on the top surface of the first electrode 450 disposed in the contact hole CH.

At least one protrusion 454 may be integrally formed with the first electrode 450. However, embodiments of the disclosure are not limited thereto. For example, a border may exist between at least one protrusion 454 and the first electrode 450.

When a plurality of protrusions 454 are provided on the top surface of the first electrode 450, some of the protrusions 454 may be spaced apart from, or positioned adjacent to, each other. The plurality of protrusions 454 may be provided at a regular interval (including the case where the interval is 0), in a regular size or shape or may be provided at different intervals or in different sizes or shapes.

The arrangement of the plurality of protrusions 454 are described below in detail with reference to FIG. 5.

Figure 5:
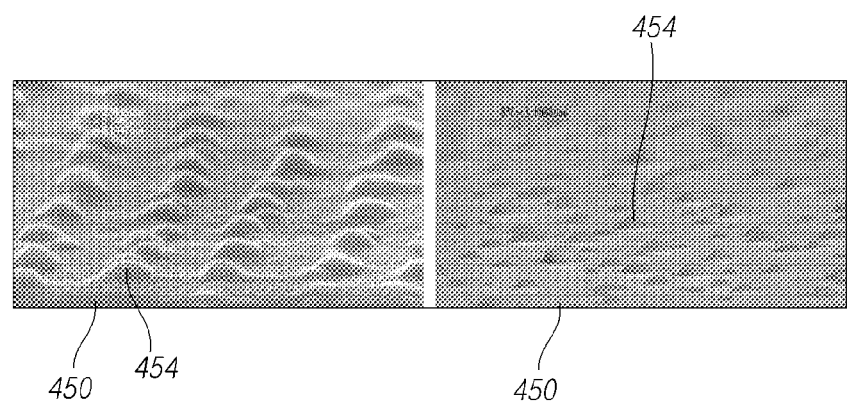
FIG. 5 is a view illustrating an arrangement of a plurality of protrusions on the top surface of a first electrode.

FIG. 5 is a view illustrating an arrangement of a plurality of protrusions on the top surface of a first electrode.

Referring to FIG. 5, a plurality of protrusions 454 may be disposed along a plurality of rows and columns. For example, the plurality of protrusions 454 may be disposed in a matrix form. At least two of the protrusions disposed in the same row or the same column may be positioned adjacent to each other, but embodiments of the disclosure are not limited thereto.

The plurality of protrusions 454 may be irregularly arranged on the top surface of the first electrode 450. In this case, the plurality of protrusions 454 may have irregular sizes and shapes, but embodiments of the disclosure are not limited thereto. For example, the plurality of protrusions 454 may have either a regular size or a regular shape.

The plurality of protrusions 454 each may be formed in various shapes, e.g., a semi-sphere, a semi-spheroid, or a polyhedron. In another aspect, the cross section of the protrusion 454 may be formed in various shapes, e.g., a circle, an ellipse, or a polygon.

The plurality of protrusions 454 may be integrally formed with the first electrode 450 as shown in FIG. 4 or may be separated from the first electrode 450 as shown in FIG. 5.

The plurality of protrusions 454 and the first electrode 450 may include materials corresponding to each other or may include different materials.

A bank 480 may be disposed on portions of the insulation film 440 and the first electrode 450 as shown in FIG. 4.

The bank 480 may include a first portion 481 disposed on the first electrode 450 in an area corresponding to a portion of the concave portion 443 provided in the insulation film 440 and a second portion 482 disposed on the insulation film 440 and the first electrode 450 in an area corresponding to the surrounding portion 444 provided in the insulation film 440.

The bank 480 may be disposed to expose a portion of the top surface of the first electrode 450 in the area overlapping the concave portion 443. In other words, at least one subpixel may have an area in which the first electrode 450 does not overlap the bank 480.

The organic layer 460 with an emission layer may be disposed on the first electrode 450 not overlapping the bank 480. The organic layer 460 may be disposed on the top surface of the first electrode 450 not overlapping the bank 480.

The organic layer 460 may have a surface shape corresponding to the shape of the top surface of the first electrode 450 having at least one protrusion 454. That is, the surface shape of the organic layer 460 may have the surface shape formed along the shape of the protrusion 454 provided on the top surface of the first electrode 450.

The second electrode 470 may be disposed while covering the organic layer 460 and the bank 480.

The second electrode 470 may have a surface shape corresponding to the surface shape of the organic layer 460 in the area overlapping the organic layer 460. That is, the second electrode 470 may also have a surface shape formed along the shape of the protrusion 454.

The organic layer 460 of the organic light emitting diode (OLED) may be formed by deposition or coating featuring straightness. For example, the organic layer 460 may be formed by physical vapor deposition (PVD), e.g., evaporation.

Formed by the method, the organic layer 460 may have a first thickness in an area having a predetermined angle from the horizontal surface and a second thickness in an area parallel with the horizontal surface, wherein the first thickness is smaller than the second thickness.

For example, the thickness of the organic layer 460 disposed in the area corresponding to the inclined portion 442 of the concave portion 443 may be smaller than the thickness of the organic layer 460 disposed on the top surface of the first electrode 450 exposed by the bank 480. Further, the thickness of the organic layer 460 disposed in the area corresponding to the inclined portion 442 of the concave portion 443 may be smaller than the thickness of the organic layer 460 disposed on the surrounding portion 444 of the insulation film 440.

Thus, when the organic light emitting diode (OLED) is driven, the area where the thickness of the organic layer 460 is relatively small, i.e., the area corresponding to the inclined portion 442 of the concave portion 443, may have the highest current density, and a strong electric field may be applied to the area corresponding to the inclined portion 442 of the concave portion 443.

The light emission characteristics of the organic light emitting diode (OLED) in the area corresponding to the inclined portion 442 of the concave portion 443 may be rendered to differ from the light emission characteristics of the organic light emitting diode (OLED) in the area corresponding to the flat portion 441 of the concave portion 443, and the OLED may be deteriorated.

According to an embodiment of the disclosure, as the bank 480 is disposed to cover the inclined portion 442 of the concave portion 443, the OLED may be prevented from being deteriorated in the area corresponding to the inclined portion 442 of the concave portion 443, and so is the phenomenon that the light emission characteristics are rendered to differ per area.

However, the thickness conditions for the organic layer 460, according to embodiments of the disclosure, are not limited thereto, but the organic layer 460 may rather have a corresponding thickness per position.

Meanwhile, the first electrode 450 may include a light reflective metal. Although FIG. 4 illustrates a configuration in which the first electrode 450 is a single layer, embodiments of the disclosure are not limited thereto, but the first electrode 450 may be formed in a multi-layer structure. When the first electrode 450 has a multi-layer structure, at least one layer may include a light reflective metal.

For example, the first electrode 450 may include, but is not limited to, at least any one of aluminum, neodymium, nickel, titanium, tantalum, copper (Cu), silver (Ag), and an aluminum alloy.

The second electrode 470 may include a light-transmissive or semi-light transmissive, conductive material. For example, the second electrode 470 may include at least one kind of transparent, conductive oxide, such as indium tin oxide (ITO), indium zinc oxide (IZO), indium tin zinc oxide (ITZO), zinc oxide, or tin oxide, or may include a semi-light transmissive metal, such as magnesium, silver (Ag), or an alloy of magnesium and silver. When the source electrode 424 includes a semi-light transmissive metal, the thickness of the source electrode 424 may be smaller than the thickness of the first electrode 450.

At least one protrusion 454 provided on the top surface of the first electrode 450 may include at least one of silicon (Si), a light reflective metal, or a transparent conductive oxide.

The first electrode 450 may be disposed while covering the flat portion 441 and inclined portion 442 of the concave portion 443 of the insulation film 440.

Thus, part of the light emitted from the organic layer 460 including an emission layer may be transmitted through the second electrode 470 and extracted to the outside of the panel PNL.

Another part of the light emitted from the organic layer 460 may be directed to the first electrode 450, i.e., the first portion 451 of the first electrode 450, disposed in the position corresponding to the flat portion 441, and be reflected by the first electrode 450 or be rerouted to the source electrode 424 by at least one protrusion 454 provided on the top surface of the first portion 451 and finally extracted to the outside of the panel PNL.

The at least one protrusion 454 may allow the light, which is reflected by the first electrode 450 and resultantly fails to be extracted to the outside, to be extracted to the outside.

Specifically, the surface forming the protrusion 454 on the top surface of the first electrode 450 may have a predetermined slope with respect to the extending direction of the top surface of the first electrode 450. As the angle of incidence of the light to the inclined surface forming the protrusion 454 comes within the critical angle, multiple reflection is enabled, so that light extraction efficiency may be enhanced.

As such, the at least one protrusion 454 increases the amount of light extracted to the outside, decreasing light trapping in the organic light emitting diode (OLED).

Still another part of the light emitted from the organic layer 460 may be rerouted by at least one protrusion 454 provided on the top surface of the first electrode 450 disposed in the area corresponding to the inclined portion 442 and be extracted to the outside of the panel PNL.

The light which is not rerouted by the protrusion 454 disposed on the inclined portion 442 may pass through the first protrusion 454 and be reflected by the first electrode 450 including a light reflective metal and extracted to the outside of the panel PNL.

As described above, the placement of the first electrode 450 of the organic light emitting diode (OLED) on the inclined portion 442 of the concave portion 443 of the insulation film 440, along with providing at least one protrusion 454 on the top surface of the first electrode 450, may enhance the light extraction efficiency of the organic light emitting display panel.

As shown in FIG. 4, an auxiliary electrode AE (which may also be referred to as an auxiliary wire) contacting the second electrode 470 may further be disposed in the area corresponding to the second non-light emitting part NEA2 in the active area A/A.

Specifically, the auxiliary electrode 430 may be disposed on the inter-layer insulation film 412. The protection film 413, insulation film 440, and bank 480 may have a hole to expose the auxiliary electrode 430. The second electrode 470 may contact the auxiliary electrode 430 through the hole formed in the protection film 413, insulation film 440, and bank 480 to expose the auxiliary electrode 430.

For example, when the organic light emitting display panel is a large-size display panel, a voltage drop may occur due to the resistance of the second electrode 470, causing a difference in brightness between the periphery and center of the panel. However, in the organic light emitting display panel, according to the disclosure, the auxiliary electrode 430 contacting the second electrode 470 may prevent a voltage drop. This may prevent a difference in brightness which may arise when the organic light emitting display panel is a large-size panel.

Although FIG. 4 illustrates a configuration in which one auxiliary electrode 430 is disposed in each subpixel SP, embodiments of the disclosure are not limited thereto. For example, one auxiliary electrode 430 may be disposed per multiple subpixels SP.

Unless the organic light emitting display panel according to an embodiment of the disclosure is a large-size panel, the auxiliary electrode 430 may be omitted.

As shown in FIG. 4, a storage capacitor Cst may be disposed in the active area A/A. The storage capacitor Cst may include a first storage capacitor electrode 431 disposed on the same layer as the gate electrode 423 and a second storage capacitor electrode 432 disposed on the same layer as the source electrode 424 and the drain electrode 425, but the structure of the storage capacitor Cst of the disclosure is not limited thereto.

According to an embodiment of the disclosure, the organic light emitting display panel includes a pad area disposed in the non-active area. A plurality of pad electrodes 433 and 434 may be disposed in the pad area.

For example, a first pad electrode 433 may be disposed on the gate insulation film 422 disposed in the pad area. The inter-layer insulation film 412 may be disposed on the first pad electrode 433 to expose a portion of the top surface of the first pad electrode 433. The second pad electrode 434 contacting the first pad electrode 433 may be disposed on the first pad electrode 433 and the inter-layer insulation film 412.

Although not shown in FIG. 4, the second pad electrode 434 may be electrically connected with various circuit films.

The structure and optical path for the organic light emitting display panel, according to an embodiment of the disclosure, are described below in greater detail with reference to FIGS. 6 to 8.

Figure 6:
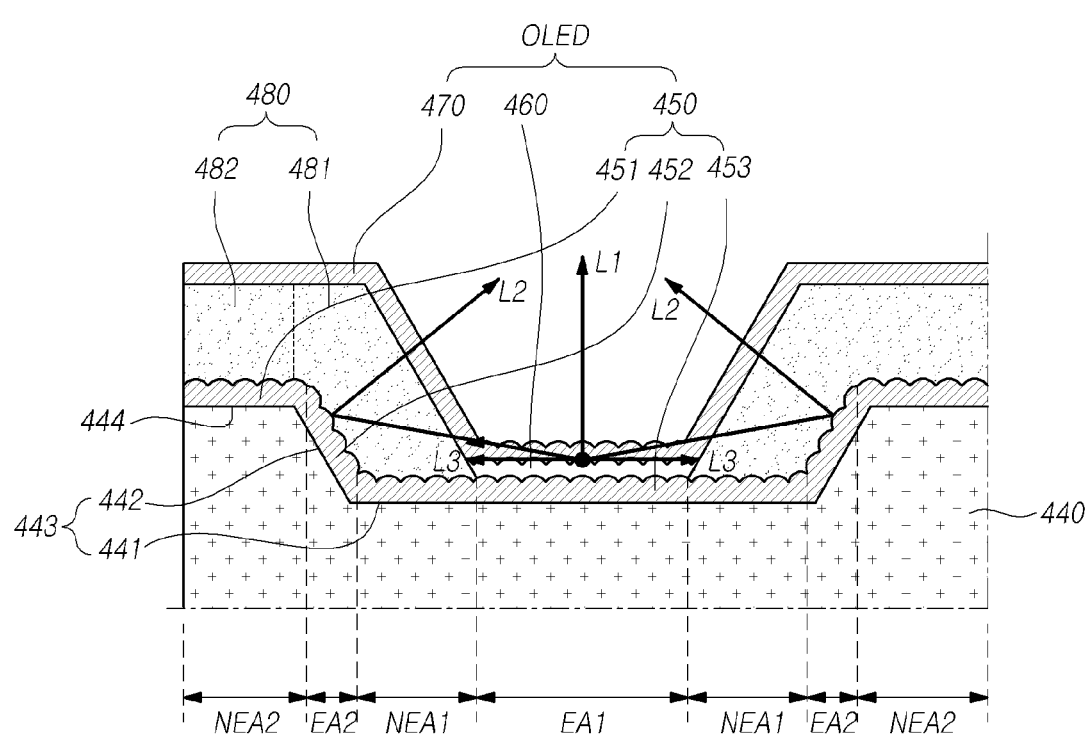
FIG. 6 is an enlarged view illustrating area X of FIG. 4.

FIG. 6 is an enlarged view illustrating area X of FIG. 4. FIG. 7 is an enlarged view illustrating area Y of FIG. 4. FIG. 8 is an enlarged view illustrating area Z of FIG. 4.

Referring to FIG. 6, at least one subpixel SP may include at least one emitting area EA, and one emitting area EA may include at least two light emitting parts EA1 and EA2. One non-light emitting part NEA1 may be disposed between the two light emitting parts EA1 and EA2.

Specifically, a first light emitting part EA1 may be an area corresponding to a portion of the concave portion 443 of the insulation film 440.

In another aspect, the first light emitting part EA1 may be an area that does not overlap the first portion 481 of the bank 480 in the flat portion 441 of the concave portion 443.

The first light emitting part EA1 may be an area in which part L1 of the light emitted from the organic layer 460 is extracted via the organic layer 460 and the second electrode 470 to the outside of the panel PNL.

The first light emitting part EA1 may be an area in which part L1 (which may be hereinafter referred to as first light) of the light emitted from the organic layer 460 arrives at the first electrode 450, is reflected by the first electrode 450, and is extracted via the organic layer 460 and the second electrode 470 to the outside of the panel PNL.

The first light emitting part EA1 may be surrounded by the first non-light emitting part NEA1.

The first non-light emitting part NEA1 may correspond to the area in which the bank 480 overlaps the flat portion 441 of the concave portion 443. Specifically, the first non-light emitting part NEA1 may correspond to the area in which the first portion 481 of the bank 480 overlaps the flat portion 441 of the concave portion 443.

The first non-light emitting part NEA1 may be an area in which part L3 of the light emitted from the organic layer 460 is directed to the area corresponding to the first portion 481 of the bank 480 but may not be extracted to the outside. In other words, the first non-light emitting part NEA1 may be an area in which the light emitted from the organic layer 460 in the direction parallel with the flat portion 441 arrives at the first electrode 450 but is trapped in the subpixel rather than reflected to the outside.

The second light emitting part EA2 may be disposed to surround the first non-light emitting part NEA1. The second light emitting part EA2 may be an area corresponding to the area in which the first electrode 450 overlaps the inclined portion 442 of the concave portion 443. In another aspect, the second light emitting part EA2 may be an area corresponding to the second area 452 of the first electrode 450.

Part L2 (which may be hereinafter referred to as second light) of the light emitted from the organic layer 460 may be directed to the area corresponding to the second area 452 of the first electrode 450.

Specifically, the second light L2 travels through the first portion 481 of the bank 480 to the area corresponding to a portion of the second area 452 of the first electrode 450. Upon reaching the first electrode 450, the second light L2 is reflected by the first electrode 450 and is extracted through the first portion 481 of the bank 480, organic layer 460, and second electrode 470 to the outside. As the second light L2 is so extracted, the second light emitting part EA2 comes into being.

The first non-light emitting part NEA1 disposed between the first light emitting part EA1 and second light emitting part EA2 may be an area where the visible rays from the first light emitting part EA1 and the visible rays from the second light emitting part EA2 are mixed, but embodiments of the disclosure are not limited thereto.

The second non-light emitting part NEA2 may be disposed to surround the second light emitting part EA2. The second non-light emitting part NEA2 may correspond to the area in which the second portion 482 of the bank 480 is disposed.

In the organic light emitting display panel according to embodiments of the disclosure, the inclined portion 442 of the concave portion 443 and the bank 480 disposed on the inclined portion 442 of the concave portion 443 may have specific conditions to increase the amount of light extracted from the second light emitting part EA2.

Figure 7:
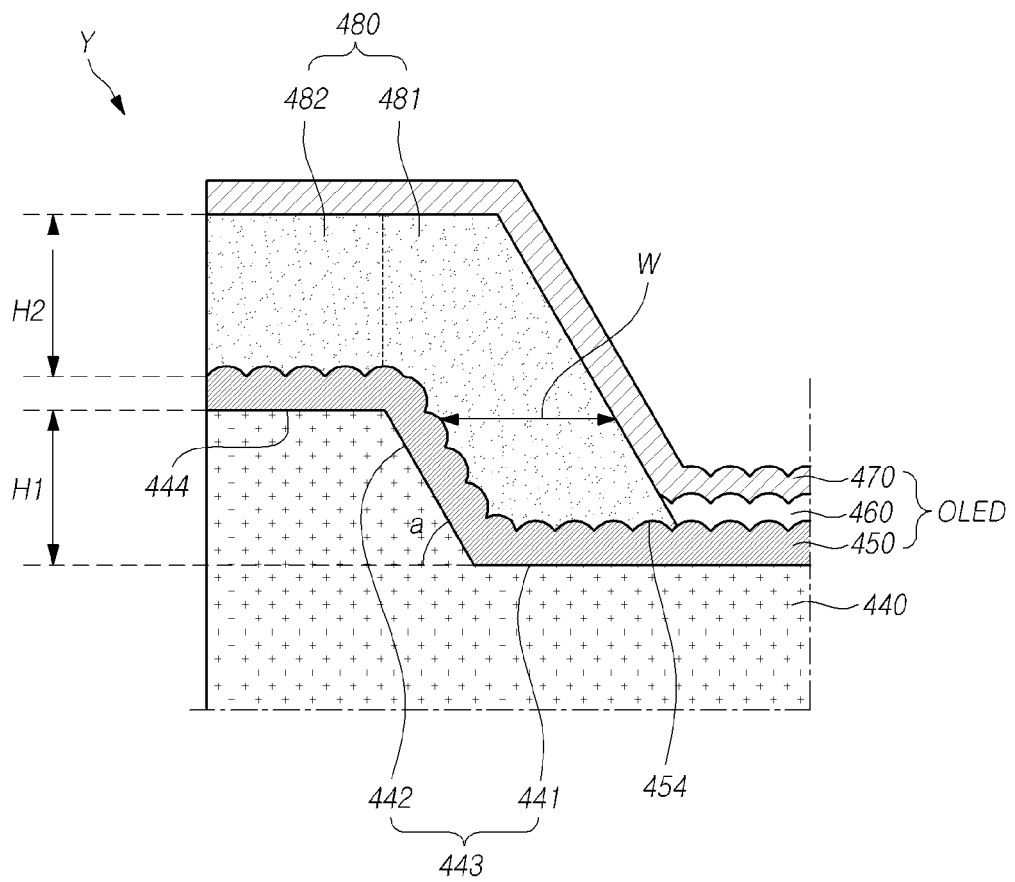
FIG. 7 is an enlarged view illustrating area Y of FIG. 4.

Referring to FIG. 7, the height H1 of the inclined portion 442 of the insulation film 440 (or the depth of the concave portion) may be 0.7 µm or more. The height H1 of the inclined portion 442 means the minimum distance from the line extending in parallel with the surface of the substrate 410, from the surface of the flat portion 441 of the concave portion 443 to the surrounding portion 444

According to an embodiment of the disclosure, the height H1 of the insulation film 440 where the inclined portion 442 of the concave portion 443 is positioned is not limited to the above-described value. For example, the height H1 may be any height at which the components under the insulation film 440 are not exposed by the concave portion 443 of the insulation film 440.

The height H1 of the inclined portion 442 may be larger than the height H2 of the bank 480 disposed on the surrounding portion 444 of the insulation film 440. In another aspect, the height H1 of the inclined portion 442 may be equal to the height H2 of the second portion of the bank 480.

As such, as the height H1 of the inclined portion 442 increases, the amount of light reflected in the second area 452 of the first electrode 450 increases, enhancing light extraction efficiency.

The angle a between the inclined portion 442 of the concave portion 443 and the horizontal surface may be not less than 27° and less than 80°.

When the angle a is less than 27°, the light emitted from the organic layer 460 may fail to arrive at the first electrode 450 disposed on the inclined portion 442 but may rather be delivered to another adjacent subpixel, causing color mixing, or may be trapped in the panel PNL without being extracted to the outside.

When the angle a exceeds 80°, an open circuit may occur in, e.g., the first electrode 450 disposed on the inclined portion of the insulation film 440.

In the area corresponding to the inclined portion 442 of the concave portion 443, the distance W between the bank 480 and the surface of the first electrode 450 may be not more than 3.2 µm, not more than 2.6 µm, or not more than 2.0 µm.

In another aspect, the distance W between the bank 480 and the surface of the first electrode 450 in the second area 452 of the first electrode 450 may be not more than 3.2 µm, not more than 2.6 µm, or not more than 2.0 µm.

As W decreases, the first light emitting part EA1 may be expanded, and the optical path of the light reflected and extracted from the second area 452 may be shortened, enhancing light extraction efficiency. Thus, the lower limit of W, although not particularly limited, may be not less than 0.1 µm, not less than 0.3 µm, or not less than 0.5 µm.

By so adjusting the range of W as above, the first light emitting part EA1 may be enlarged, and light extraction efficiency may be enhanced in the organic light emitting display panel.

Of the light emitted from the organic layer 460, the second light L2 arriving at the area corresponding to a portion of the second area 452 of the first electrode 450 passes through the bank 480 at least two times until it is extracted to the outside of the panel.

When the bank 480 includes a colored organic, or inorganic, material, the light of a short wavelength in the visible light wavelength spectrum may be absorbed and, thus, does not pass through the bank 480 and the second light emitting part EA2 where the second light L2 is extracted, and the color coordinates of the first light emitting part EA1 where the first light L1 is extracted to the outside may be varied. For example, the color coordinates of the second light emitting part EA2 may be shifted to a longer wavelength band than that for the color coordinates of the first light emitting part EA1.

When the bank 480 includes a transparent organic, or inorganic, material, the color coordinates of the light emitted from the first light emitting part EA1 may correspond to the color coordinates of the light emitted from the second light emitting part EA2.

In the organic light emitting display device according to an embodiment of the disclosure, light extraction may also be achieved through at least one protrusion 454 of the first electrode 450 provided in the contact hole CH.

This is described below with reference to FIG. 8.

Figure 8:
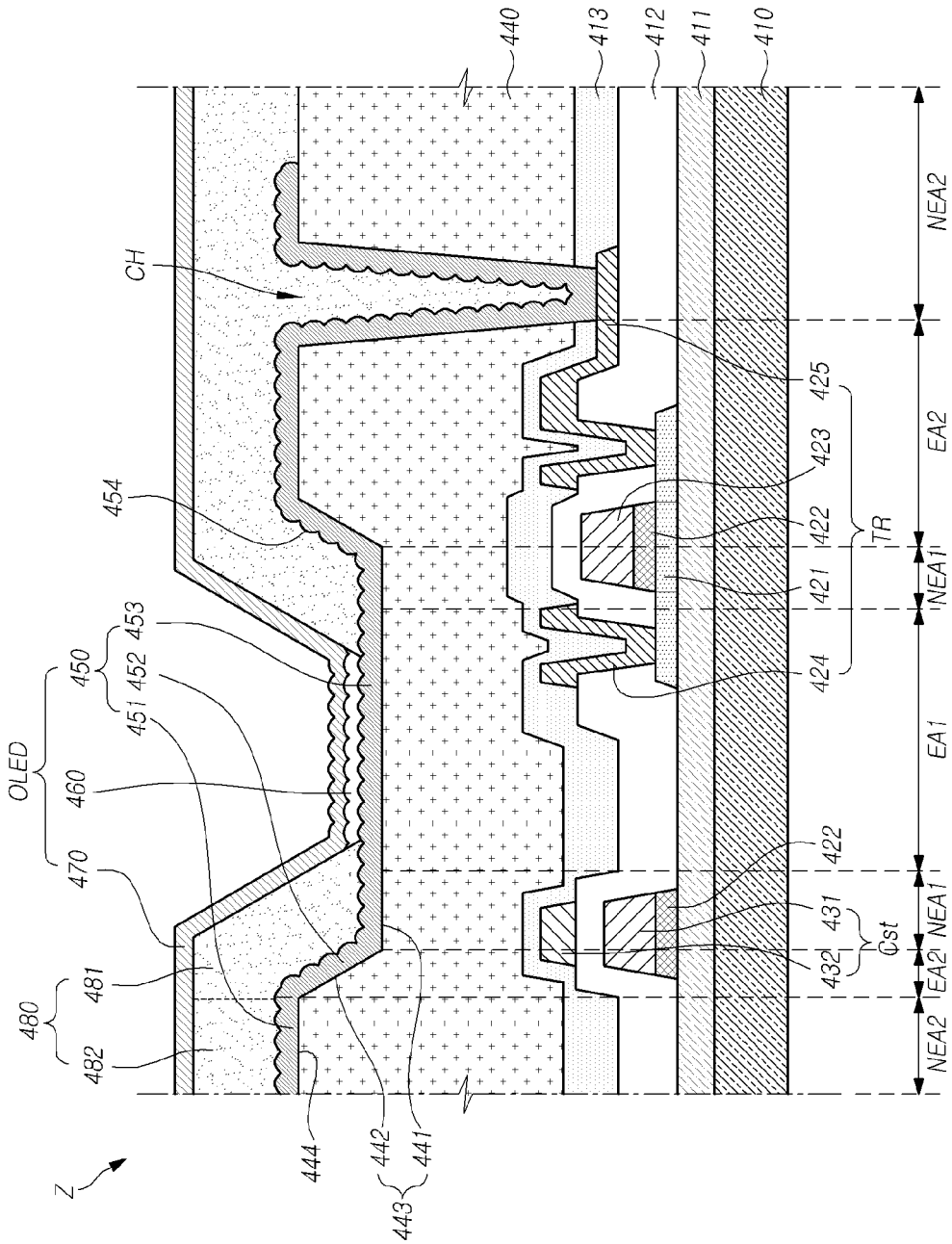
FIG. 8 is an enlarged view illustrating area Z of FIG. 4.

Referring to FIG. 8, part L4 of the light emitted from the organic layer 460 may be extracted to the outside of the panel PNL through at least one protrusion 454 provided in the contact hole CH where the first electrode 450 is connected with the drain electrode 425 of the thin film transistor TR.

Specifically, part L4 of the light emitted from the organic layer 460 including an emission layer may be directed to the area corresponding to the first portion 481 of the bank 480, and light rays of the light L4, which are not absorbed by the bank 480, may be transmitted through the insulation film 440 to the first electrode 450 disposed in the contact hole CH.

Depending on the thickness of the first electrode 450 disposed in the contact hole CH, the light having arrived at the first electrode 450 may be absorbed by the first electrode 450 or extracted to the outside of the panel PNL through at least one protrusion 454 provided on the top surface of the first electrode 450.

For example, when the first electrode 450 including a light reflective material is sufficiently thin, the light arriving at the first electrode 450 disposed in the contact hole CH may reach the protrusion 454 provided on the top surface of the first electrode 450, and the protrusion 454 may lead the light L4 to be reflected and extracted to the outside of the panel PNL.

In this case, the second light emitting part EA2 may be enlarged over the second light emitting part EA2 of FIG. 6.

In other words, in one subpixel, the second light emitting part EA2 may encompass the area in which the first electrode 450 overlaps the inclined portion 442 of the concave portion 443 of the insulation film 440 through up to the area where the first electrode 450 is disposed on at least one side surface of the contact hole CH (the contact hole where the first electrode 450 contacts the thin film transistor) of the insulation film 440.

In this case, however, the brightness of the second light emitting part EA2 may be reduced as it goes away from the area where the first electrode 450 overlaps the inclined portion 442.

Such a structure allows for a larger emitting area in the active area of the organic light emitting display device according to an embodiment of the disclosure.

The effects of the display device according to an embodiment of the disclosure are discussed below with reference to FIG. 9.

Figure 9:
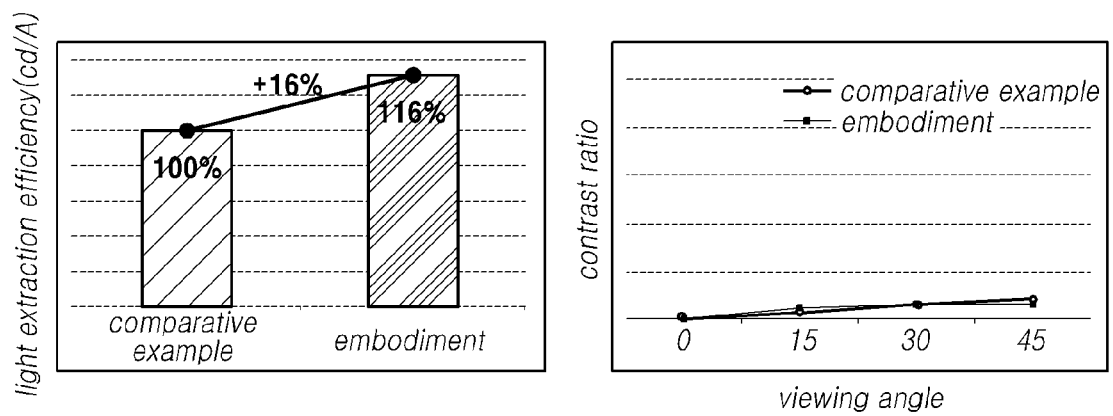
FIG. 9 is a graph illustrating a light extraction efficiency and a contrast ratio (automatically adjusted by the light radiated from the outside) depending on the viewing angle of an organic light emitting display device according to a comparative example and an organic light emitting display device according to an embodiment of the disclosure.

FIG. 9 is a graph illustrating a light extraction efficiency and a contrast ratio (automatically adjusted by the light radiated from the outside) depending on the viewing angle of an organic light emitting display device according to a comparative example and an organic light emitting display device according to an embodiment of the disclosure.

The organic light emitting display device, according to the comparative example, lacks the concave portion 443 in the insulation film 440 and the protrusion 454 on the top surface of the first electrode 450 as shown in FIG. 4, and the organic light emitting display device, according to an embodiment of the disclosure, has the structure of FIG. 4.

Referring to FIG. 9, when the light extraction efficiency of the display device according to the comparative example is 100%, the light extraction efficiency of the organic light emitting display device according to the instant embodiment is 116% which is higher than the light extraction efficiency of the display device of the comparative example.

It may also be identified that, albeit with the concave portion 443 of the insulation film 440 in the area corresponding to the first light emitting part and the second light emitting part and at least one protrusion 454 on the top surface of the first electrode 450, the organic light emitting display device according to the instant embodiment makes no difference in contrast ratio from the organic light emitting display device according to the comparative example.

As such, the organic light emitting display device according to an embodiment of the disclosure may enhance light extraction efficiency without deteriorating viewing angle characteristics.

Although FIGS. 4 to 8 illustrate an example in which a plurality of protrusions 454 are provided on the whole top surface of the first electrode 450, embodiments of the disclosure are not limited thereto.

Another arrangement of protrusions 454 on the top surface of the first electrode 450 is discussed below with reference to FIG. 10.

Figure 10:
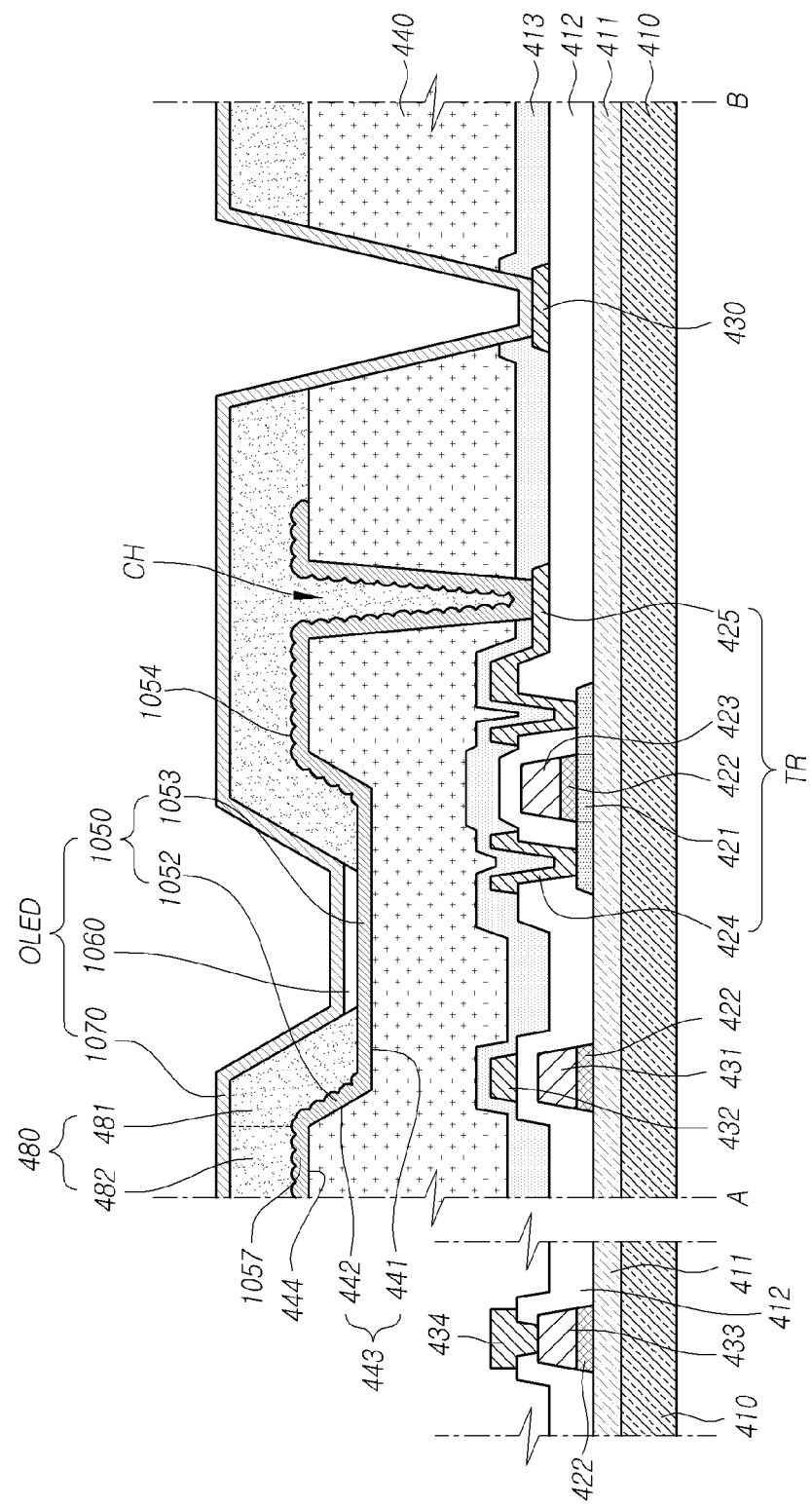
FIG. 10 is a cross-sectional view illustrating an organic light emitting display device according to another embodiment of the disclosure.

FIG. 10 is a cross-sectional view illustrating an organic light emitting display device according to another embodiment of the disclosure.

Substantially the same configurations and effects as those described above are not repeatedly described below.

Referring to FIG. 10, at least one protrusion 1054 may be provided on the top surface of a first electrode 1050.

The protrusion 1054 may be provided on a portion of the top surface of the first electrode 1050 disposed in the area corresponding to the area where the concave portion 443 in the insulation film 440 is disposed. Specifically, at least one protrusion 1054 may be provided on the top surface of the first electrode 1050 disposed in the area corresponding to the area where the inclined portion 442 of the concave portion 443 is disposed, but may not be provided on the top surface of the first electrode 1050 disposed in the area corresponding to the area where the flat portion 441 of the concave portion 443 is disposed.

The protrusion 1054 may be provided on the whole top surface of the first electrode 1050 disposed in the area corresponding to the area where the surrounding portion 444 of the insulation film 440 is disposed.

Part of the light emitted from the organic layer 460 may be rerouted by at least one protrusion 454 provided on the top surface of the first electrode 450 disposed in the area corresponding to the inclined portion 442 and be extracted to the outside of the panel PNL.

This may prevent light leakage which may arise when the light emitted from one subpixel travels over to another subpixel, while enhancing light extraction efficiency.

As described above, since no protrusion 1054 is disposed on the top surface of the first electrode 1050 disposed in the area corresponding to the area where the flat portion 441 of the insulation film 440 is disposed, the surface of the first electrode 1050 may be flattened in the area corresponding to the area where the flat portion 441 of the insulation film 440 is disposed.

Thus, as shown in FIG. 10, the surface of the organic layer 1060 disposed on the top surface of the first electrode 1050 exposed by the bank 480 may be planarized.

Further, the surface of the source electrode 424 may be flattened in the area overlapping the organic layer 1060.

Although FIG. 10 illustrates a configuration in which the plurality of protrusions 1054 are not disposed in the whole top surface of the first electrode 1050 disposed in the area corresponding to the area where the flat portion 441 of the concave portion 443 is disposed, embodiments of the disclosure are not limited thereto. For example, such a configuration may suffice in which the protrusions 1054 may be disposed on a portion of the top surface of the first electrode 1050 in the area corresponding to the area where the concave portion 443 of the insulation film 440 is disposed or be disposed on a portion of the top surface of the first electrode 1050 in the area corresponding to the area where the surrounding portion 444 of the insulation film 440 is disposed.

As such, the density of protrusions 454 provided in the area corresponding to the area where the flat portion 441 of the concave portion 443 is disposed may differ from the density of protrusions 454 provided in the area corresponding to the area where the inclined portion 442 of the concave portion 443 is disposed.

Although FIGS. 4 to 8 and 10 illustrate a configuration in which the organic layer 460 or 1060 of the organic light emitting diode (OLED) is disposed on the first electrode 450 or 1050 exposed by the bank 480, embodiments of the disclosure are not limited thereto.

The structure of an organic light emitting display device, according to another embodiment of the disclosure, is described below with reference to FIG. 11.

Figure 11:
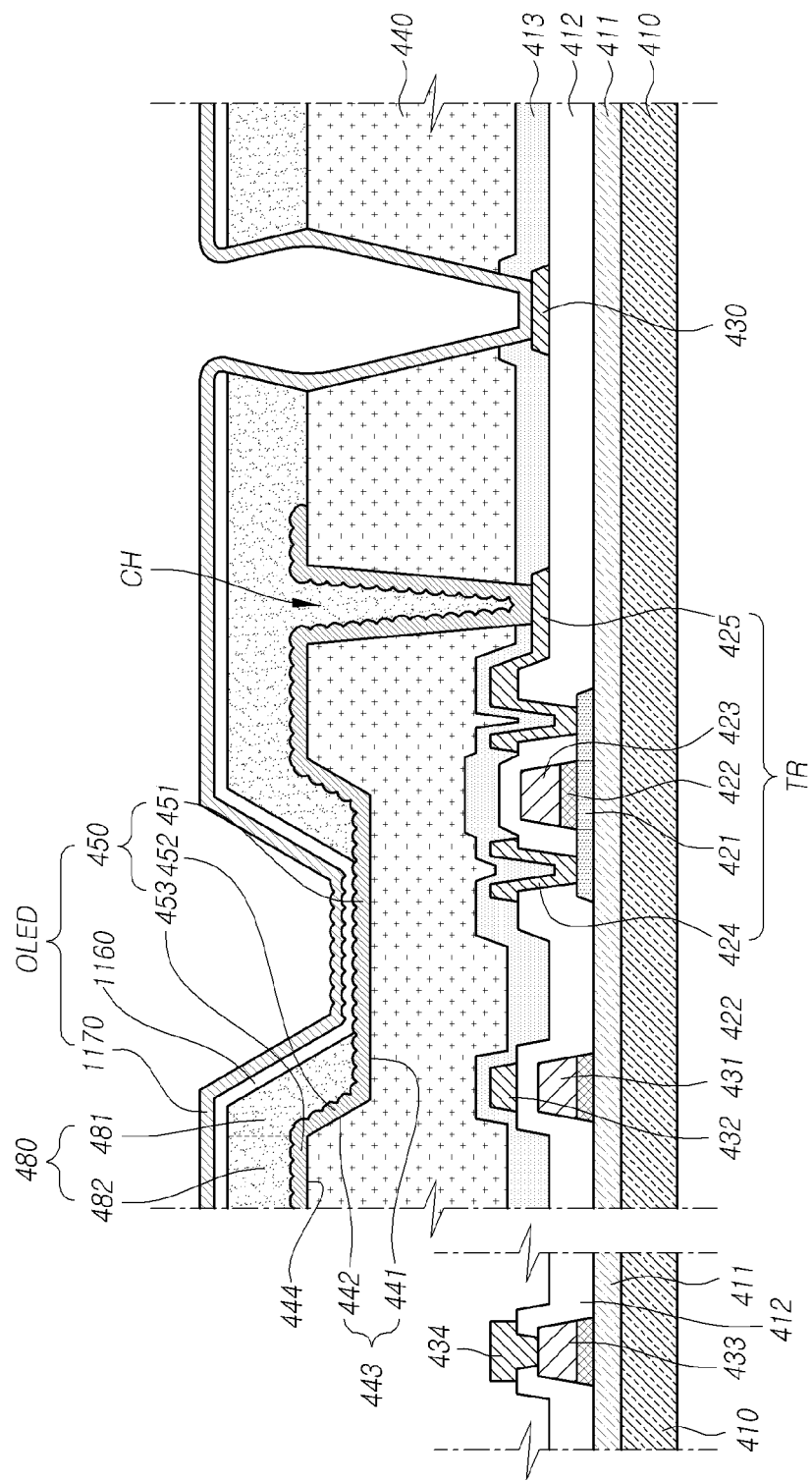
FIG. 11 is a cross-sectional view illustrating an organic light emitting display device according to yet another embodiment of the disclosure.

FIG. 11 is a cross-sectional view illustrating an organic light emitting display device according to yet another embodiment of the disclosure.

Substantially the same configurations and effects as those described above are not repeatedly described below.

In the structure of FIG. 11, unlike that of FIG. 4, the organic layer 1160 of the organic light emitting diode (OLED) may overlap the first electrode 450 and be disposed in the area overlapping the top surface of the bank 480.

In this case, to allow the second electrode 1170 and the auxiliary electrode 430 to contact each other, the bank 480 may have such a structure that prevents the material of the organic layer 1160 from being deposited on the auxiliary electrode 430 in the process of forming the organic layer 1160.

Specifically, as shown in FIG. 11, the bank 480 may be shaped to narrow as it goes away from the substrate 410 in the area surrounding the hole exposing the auxiliary electrode 430. In other words, as the bank 480 goes farther away from the substrate 410, the mouth of the hole of the bank 480 exposing the auxiliary electrode 430 may become narrower.

As the process for forming the organic layer 1160, deposition or coating may be adopted in which the source material features straightness. For example, evaporation may be used. As the process of forming the second electrode 1170, deposition or coating may be used in which the source material has irregular directivity. For example, sputtering may be put to use.

Since the mouth of the hole of the bank 480 exposing the auxiliary electrode 430 is narrow, the organic layer 1160 may not be disposed on the auxiliary electrode 430 due to the processing properties of the organic layer 1160. Since the source material of the second electrode 1170 may enter the hole due to the processing properties of the second electrode 1170 although the mouth of the hole of the bank 480 is narrow, the second electrode 1170 may be formed also on the auxiliary electrode 430.

The organic light emitting display panel according to embodiments of the disclosure may have at least one pixel, and one pixel may have at least two subpixels.

Each subpixel may have one first electrode.

At least one protrusion may be provided on the top surface of the first electrode disposed in at least one subpixel among the plurality of subpixels included in the organic light emitting display panel.

A configuration in which protrusions are provided on the top surface of the first electrode in one pixel including a plurality of subpixels is described below with reference to FIGS. 12 to 16.

FIGS. 12, 13, 14, 15, and 16 are views illustrating protrusions on the top surface of a first electrode in one pixel.

Substantially the same configurations and effects as those described above are not repeatedly described below.

Figure 12:
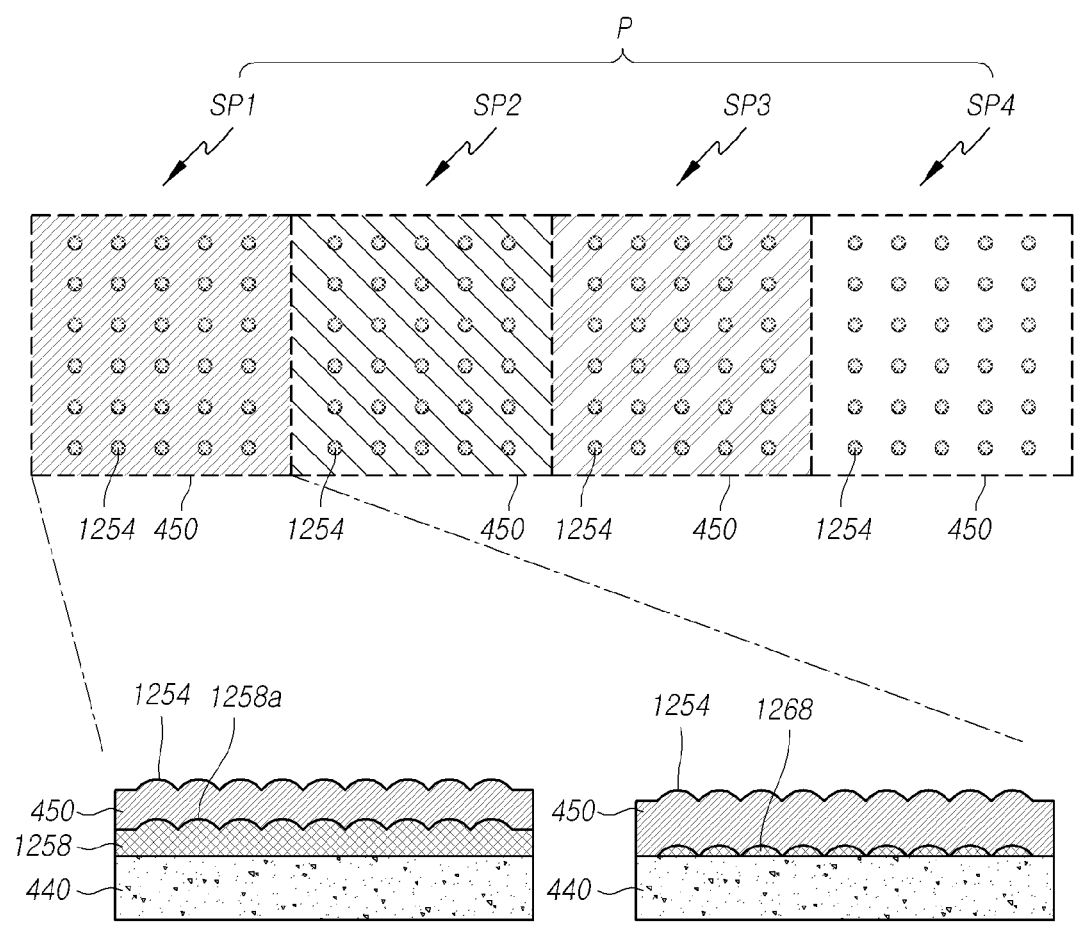
FIGS. 12, 13, 14, 15, and 16 are views illustrating protrusions on the top surface of a first electrode in one pixel.

Referring to FIG. 12, one pixel P may include a first subpixel SP1, a second subpixel SP2, a third subpixel SP3, and a fourth subpixel SP4. Although FIG. 12 illustrates a configuration in which one pixel P includes four subpixels, embodiments of the disclosure are not limited thereto, and it suffices that one pixel P has two or more subpixels.

According to an embodiment of the disclosure, the first to fourth subpixels SP1, SP2, SP3, and SP4 may emit different colors of light. For example, the first subpixel SP1 may be a subpixel for emitting red light, the second subpixel SP2 may be a subpixel for emitting green light, the third subpixel SP3 may be a subpixel for emitting blue light, and the fourth subpixel SP4 may be a subpixel for emitting white light.

However, the above-described configuration is merely an example and, in the instant embodiment, it suffices that at least two subpixels of the first to fourth subpixels SP1, SP2, SP3, and SP4 emit different colors of light.

The first electrode 450 of the organic light emitting diode (OLED) may be disposed in each of the first to fourth subpixels SP1, SP2, SP3, and SP4. A plurality of protrusions 1254 may be provided on the top surface of the first electrode 450.

The protrusions 1254 respectively disposed in the subpixels SP1, SP2, SP3, and SP4 may correspond in size and shape to each other.

The plurality of protrusions 1254 disposed in each subpixel SP1, SP2, SP3, and SP4 may be spaced apart from each other in each subpixel SP1, SP2, SP3, and SP4 and, thus, different protrusions 1254 may remain at a constant interval.

Although FIGS. 4 to 11 illustrate a configuration in which protrusions 1254 are provided on the top surface of the first electrode 450 which is formed of a single layer, embodiments of the disclosure are not limited thereto.

For example, an inorganic film 1258 with a plurality of protrusions 1258a on the surface thereof may be disposed on the insulation film 440, and the first electrode 450 may be disposed on the inorganic film 1258. In this case, the shape of the surface of the first electrode 450 may correspond to the shape of the surface of the inorganic film 1258.

A plurality of protrusions 1254 including a light reflective metal or transparent conductive material may be disposed on the insulation film 440. The first electrode 450 may be disposed on the plurality of protrusions 1268. The shape of the surface of the first electrode 450 may correspond to the shape of the surface of the plurality of protrusions 1268.

Although FIG. 12 illustrates a configuration in which the first electrode 450 is a single layer, embodiments of the disclosure are not limited thereto, but the first electrode 450 may be formed in a multi-layer structure. When the first electrode 450 has a multi-layer structure, at least one layer may include a light reflective metal.

Figure 13:
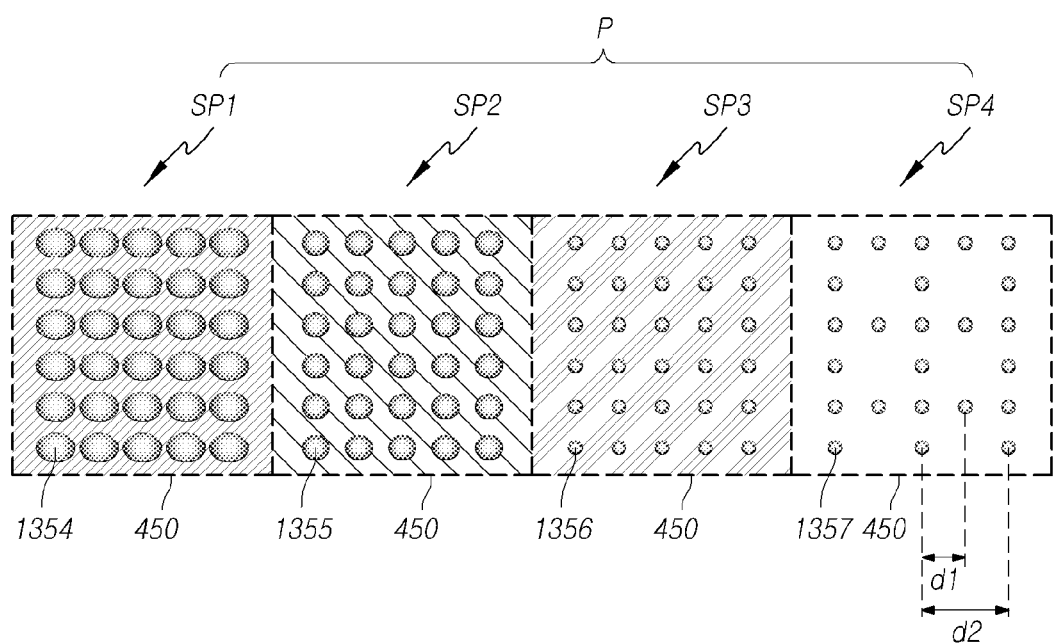

However, embodiments of the disclosure are not limited thereto. As shown in FIG. 13, the size of the protrusions 1354 provided in the first subpixel SP1, the size of the protrusions 1355 provided in the second subpixel SP2, and the size of the protrusions 1356 provided in the third subpixel SP3 may differ from each other. The size of the protrusions 1356 provided in the third subpixel SP3 may correspond to the size of the protrusions 1357 provided in the fourth subpixel SP4.

For example, the size of the protrusions 1354 provided in the first subpixel SP1 may be larger than the size of the protrusions 1355 provided in the second subpixel SP2, and the size of the protrusions 1355 provided in the second subpixel SP2 may be larger than the size of the protrusions 1356 and 1357 provided in the third and fourth subpixels SP3 and SP4. However, the above-described size relationship is merely an example.

In other words, the sizes of the protrusions in at least two subpixels may differ from each other.

Although FIG. 13 illustrates an example in which the plurality of protrusions disposed in one subpixel have the same size for ease of description, the protrusions in one subpixel may have different sizes.

Although FIG. 13 illustrates a configuration in which the protrusions in at least two subpixels have different sizes, the protrusions in at least two subpixels may have different shapes according to an embodiment of the disclosure.

As shown in FIG. 13, the plurality of protrusions 1357 disposed in at least one subpixel SP4 may be spaced apart from each other, and protrusions 1357 adjacent to each other may have different spacings d1 and d2.

According to an embodiment of the disclosure, at least two subpixels may have different protrusion densities. For example, the density of the protrusions 1356 provided in the third subpixel SP3 may be larger than the density of the protrusions 1357 provided in the fourth subpixel SP4.

Figure 14:
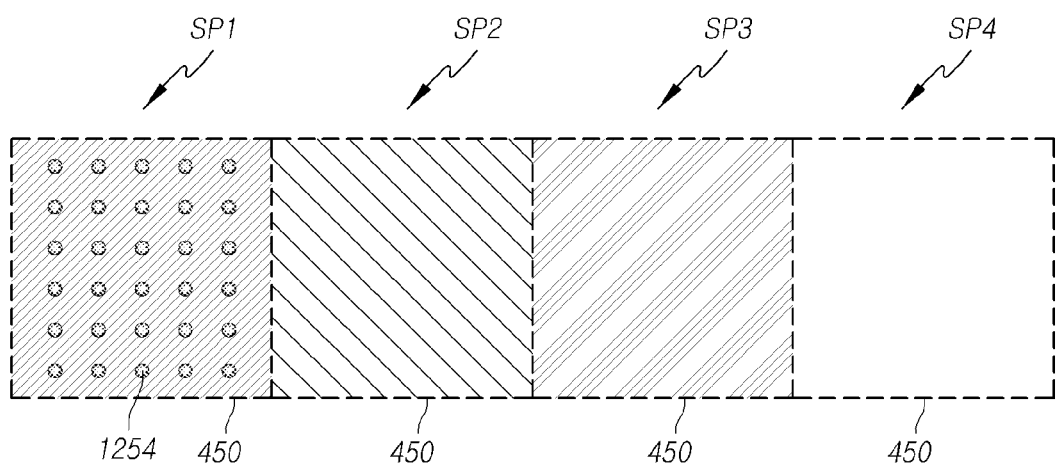
Figure 15:
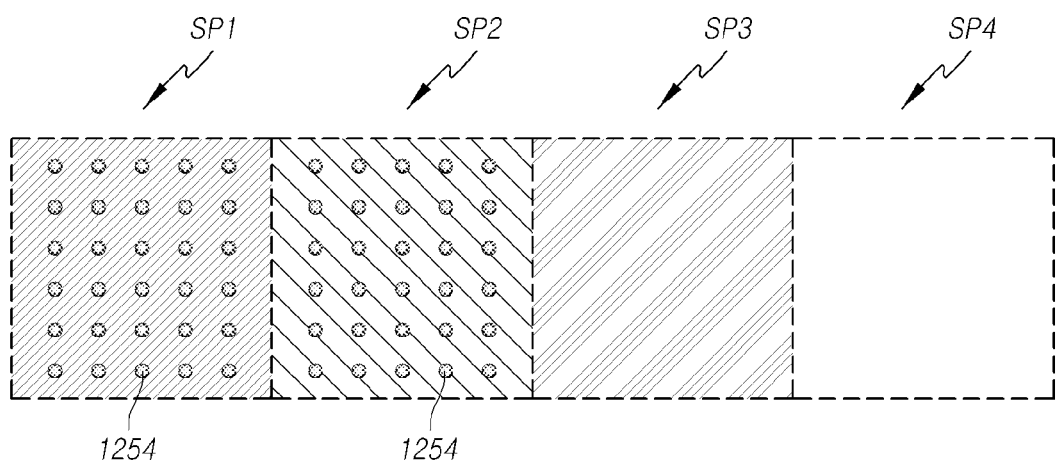
Figure 16:
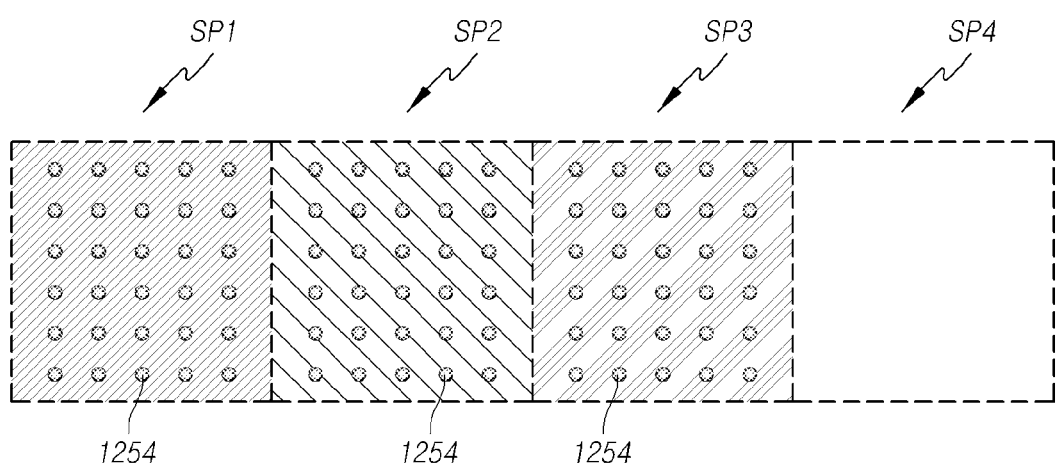

As shown in FIGS. 14 to 16, at least one subpixel may have no protrusion provided on the top surface of the first electrode 450.

For example, as shown in FIG. 14, a plurality of protrusions 1254 may be provided on the top surface of the first electrode 450 disposed only in the first subpixel SP1 or, as shown in FIG. 15, a plurality of protrusions 1254 may be provided on the top surface of the first electrode 450 disposed only in the first and second subpixels SP1 and SP2, or as shown in FIG. 16, a plurality of protrusions 1254 may be provided on the top surface of the first electrode 450 disposed only in the first to third subpixels SP1, SP2, and SP3, but embodiments of the disclosure are not limited thereto.

As described above, according to an embodiment of the disclosure, at least one of the size and density (inter-protrusion spacing) of the protrusions provided on the top surface of the first electrode may differ between at least two subpixels emitting different colors of light.

In other words, according to an embodiment of the disclosure, protrusions modified in various manners may be disposed on the top surface of the first electrode 450 considering the optical characteristics or element characteristics of the organic light emitting diode (OLED) disposed in each subpixel SP1, SP2, SP3, and SP4.

According to embodiments of the disclosure, as the first electrode of the organic light emitting diode (OLED) is disposed on the inclined portion of the concave portion 443, and at least one protrusion is provided on the top surface of the first electrode, the organic light emitting display panel and organic light emitting display device may have a structure with enhanced light extraction efficiency.

According to embodiments of the disclosure, there may be provided an organic light emitting display panel and organic light emitting display device, which has a structure capable of preventing color mixing between two adjacent subpixels.

According to embodiments of the disclosure, there may be provided an organic light emitting display panel and organic light emitting display device, which has an increased emitting area in the active area.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown, but is to be accorded the widest scope consistent with the claims. The scope of protection of the disclosure should be construed based on the following claims, and all technical ideas within the scope of equivalents thereof should be construed as being included within the scope of the disclosure.

LEGEND OF REFERENCE NUMBERS

440: insulation film
441: flat portion
442: inclined portion
443: concave portion
444: surrounding portion
450: first electrode
454: protrusion
460: organic layer
470: second electrode

What is claimed is:

1. An organic light emitting display panel including an active area with a plurality of subpixels, the organic light emitting display panel comprising:
   a substrate;
   an insulation film disposed on the substrate and including at least one concave portion, the at least one concave portion including a flat portion and a linear inclined portion surrounding the flat portion in at least one subpixel of the active area;
   a first electrode disposed on a portion of the at least one concave portion and a surrounding portion disposed around the at least one concave portion in the at least one subpixel area, the first electrode including at least one protrusion on a surface thereof;
   a bank including a first portion disposed on the first electrode in an area corresponding to a portion of the at least one concave portion and a second portion disposed on the insulation film and the first electrode in an area corresponding to the surrounding portion;
   an organic layer overlapping the at least one concave portion and disposed on the first electrode, the organic layer having a surface shape corresponding to a shape of a top surface of the first electrode having the at least one protrusion on the first electrode; and a second electrode disposed on the organic layer and the bank, the second electrode having a surface shape corresponding to the surface shape of the organic layer in an area overlapping the organic layer, wherein the organic light emitting display panel includes at least two subpixels, wherein the first electrode is disposed in each of the at least two subpixels, and wherein at least one of a density and a size of the at least one protrusion provided on the top surface of the first electrode differs between at least two subpixels emitting different colors of light.

2. The organic light emitting display panel of claim 1, wherein the first electrode includes a light reflective metal.

3. The organic light emitting display panel of claim 1, wherein in the at least one subpixel area, at least one thin film transistor is disposed on the substrate and under the insulation film, wherein the insulation film includes a contact hole to expose a top surface of a source electrode or drain electrode of the thin film transistor, and wherein the first electrode is electrically connected with the source electrode or the drain electrode through the contact hole.

4. The organic light emitting display panel of claim 3, wherein the at least one protrusion is provided on the top surface of the first electrode disposed in the contact hole.

5. The organic light emitting display panel of claim 1, wherein the at least one protrusion is provided on a whole or part of the top surface of the first electrode disposed in an area corresponding to an area where the at least one concave portion is disposed, and wherein the at least one protrusion is provided on the whole top surface of the first electrode disposed in an area corresponding to an area where the surrounding portion is disposed.

6. The organic light emitting display panel of claim 1, wherein the at least one protrusion is not provided in an area corresponding to an area where the flat portion is disposed and is provided in an area corresponding to an area where the linear inclined portion of the at least one concave portion is disposed.

7. The organic light emitting display panel of claim 1, wherein a density of the at least one protrusion provided in an area corresponding to an area where the flat portion of the at least one concave portion is disposed differs from a density of the at least one protrusion provided in an area corresponding to an area where the linear inclined portion of the at least one concave portion is disposed.

8. The organic light emitting display panel of claim 1, wherein each of the plurality of subpixels includes an emitting area, and wherein the emitting area of at least one subpixel of the plurality of subpixels includes a first light emitting part in which a first portion of the bank does not overlap the first electrode in the flat portion of the at least one concave portion.

9. The organic light emitting display panel of claim 8, wherein the emitting area includes:

a second light emitting part surrounding the first light emitting part, and wherein the second light emitting part corresponds to an area in which the first electrode overlaps the linear inclined portion of the at least one concave portion.

10. The organic light emitting display panel of claim 9, wherein color coordinates of the first light emitting part differ from color coordinates of the second light emitting part.

11. The organic light emitting display panel of claim 9, wherein a first non-light emitting part is disposed between the first light emitting part and the second light emitting part.

12. The organic light emitting display panel of claim 11, wherein the first non-light emitting part is smaller in size than the first light emitting part and the second light emitting part.

13. The organic light emitting display panel of claim 11, wherein the first non-light emitting part corresponds to an area in which the first portion of the bank overlaps the flat portion of the at least one concave portion.

14. The organic light emitting display panel of claim 9, further comprising a second non-light emitting part surrounding the second light emitting part.

15. The organic light emitting display panel of claim 14, wherein the second non-light emitting part corresponds to an area in which the second portion of the bank is disposed.

16. The organic light emitting display panel of claim 8, wherein a second light emitting part provided in the emitting area among the plurality of subpixels includes an area in which the first electrode overlaps the linear inclined portion of the at least one concave portion through up to an area in which the first electrode is disposed on at least one side surface of a contact hole of the insulation film.

17. The organic light emitting display panel of claim 16, wherein a brightness of the second light emitting part decreases as a distance to an area where the first electrode overlaps the linear inclined portion of the at least one concave portion increases.

18. The organic light emitting display panel of claim 1, wherein a top surface of the first electrode includes a flat area disposed in the at least one subpixel that does not include any protrusions.

19. The organic light emitting display panel of claim 1, wherein the organic light emitting display panel further comprises an auxiliary electrode disposed under the insulation film, and the second electrode contacts the auxiliary electrode through a hole formed in the insulation film and the bank to expose the auxiliary electrode.

20. An organic light emitting display device including an active area with a plurality of subpixels, the organic light emitting display device comprising:

a substrate;

an insulation film disposed on the substrate and including at least one concave portion, the at least one concave portion including a flat portion and a linear inclined portion surrounding the flat portion in at least one subpixel area;

a first electrode disposed on a portion of the at least one concave portion and a surrounding portion disposed around the at least one concave portion in the at least one subpixel area, the first electrode including at least one protrusion on a surface thereof;

a bank including a first portion positioned on a portion of the at least one concave portion and a second portion positioned on the surrounding portion;

an organic layer overlapping the at least one concave portion and disposed on the first electrode, the organic layer having a surface shape corresponding to a shape of a top surface of the first electrode having the at least one protrusion on the first electrode; and a second electrode having a surface shape corresponding to the surface shape of the organic layer in an area overlapping the organic layer, wherein an area in which the first electrode does not overlap the bank is a first light emitting part in an area where the flat portion is provided, wherein an area in which the bank overlaps the first electrode is a first non-light emitting part in the area where the flat portion is provided, and wherein an area corresponding to the inclined portion is a second light emitting part.

21. The organic light emitting display device of claim 20, wherein the second light emitting part of the at least one subpixel includes an area in which the first electrode overlaps the linear inclined portion of the at least one concave portion through up to an area in which the first electrode is disposed on at least one side surface of a contact hole of the insulation film.

22. The organic light emitting display device of claim 20, further comprising a second non-light emitting part surrounding the second light emitting part.

23. An organic light emitting display panel including an active area with a plurality of subpixels, the organic light emitting display panel comprising:

a substrate;

an insulation film disposed on the substrate and including at least one concave portion, the at least one concave portion including a flat portion and a linear inclined portion surrounding the flat portion in at least one subpixel of the active area;

a first electrode disposed on a portion of the at least one concave portion and a surrounding portion disposed around the at least one concave portion in the at least one subpixel area, the first electrode including at least one protrusion on a surface thereof;

a bank including a first portion disposed on the first electrode in an area corresponding to a portion of the at least one concave portion and a second portion disposed on the insulation film and the first electrode in an area corresponding to the surrounding portion;

an organic layer overlapping the at least one concave portion and disposed on the first electrode, the organic layer having a surface shape corresponding to a shape of a top surface of the first electrode having the at least one protrusion on the first electrode; and a second electrode disposed on the organic layer and the bank, the second electrode having a surface shape corresponding to the surface shape of the organic layer in an area overlapping the organic layer, wherein the at least one protrusion is provided in an area corresponding to an area where the linear inclined portion of the at least one concave portion is disposed.

24. An organic light emitting display panel including an active area with a plurality of subpixels, the organic light emitting display panel comprising:

a substrate;

an insulation film disposed on the substrate and including at least one concave portion, the at least one concave portion including a flat portion and a linear inclined portion surrounding the flat portion in at least one subpixel of the active area;

a first electrode disposed on a portion of the at least one concave portion and a surrounding portion disposed around the at least one concave portion in the at least one subpixel area, the first electrode including at least one protrusion on a surface thereof;

a bank including a first portion disposed on the first electrode in an area corresponding to a portion of the at least one concave portion and a second portion disposed on the insulation film and the first electrode in an area corresponding to the surrounding portion;

an organic layer overlapping the at least one concave portion and disposed on the first electrode, the organic layer having a surface shape corresponding to a shape of a top surface of the first electrode having the at least one protrusion on the first electrode; and a second electrode disposed on the organic layer and the bank, the second electrode having a surface shape corresponding to the surface shape of the organic layer in an area overlapping the organic layer, wherein the at least one protrusion is provided on the top surface of the first electrode disposed in the contact hole.

25. An organic light emitting display panel including an active area with a plurality of subpixels, the organic light emitting display panel comprising:

a substrate;

an insulation film disposed on the substrate and including at least one concave portion, the at least one concave portion including a flat portion and a linear inclined portion surrounding the flat portion in at least one subpixel of the active area;

a first electrode disposed on a portion of the at least one concave portion and a surrounding portion disposed around the at least one concave portion in the at least one subpixel area, the first electrode including at least one protrusion on a surface thereof;

a bank including a first portion disposed on the first electrode in an area corresponding to a portion of the at least one concave portion and a second portion disposed on the insulation film and the first electrode in an area corresponding to the surrounding portion;

an organic layer overlapping the at least one concave portion and disposed on the first electrode, the organic layer having a surface shape corresponding to a shape of a top surface of the first electrode having the at least one protrusion on the first electrode; and a second electrode disposed on the organic layer and the bank, the second electrode having a surface shape corresponding to the surface shape of the organic layer in an area overlapping the organic layer, wherein a density of the at least one protrusion provided in an area corresponding to an area where the flat portion of the at least one concave portion is disposed differs from a density of the at least one protrusion provided in an area corresponding to an area where the linear inclined portion of the at least one concave portion is disposed.

* * * * *